US007283139B1

(12) United States Patent  
Tanaka

(10) Patent No.: US 7,283,139 B1
(45) Date of Patent: Oct. 16, 2007

(54) IMAGE PROCESSING DEVICE FOR TRANSMITTING COLOR WITH FIDELITY AND PRODUCT SELLING METHOD USING THE SAME

(75) Inventor: Norio Tanaka, Tokyo (JP)

(73) Assignee: Dainichiseika Color & Chemicals Mfg. Co., Ltd., Tokyo (JP)

( * ) Notice: Subject to any disclaimer, the term of this patent is extended or adjusted under 35 U.S.C. 154(b) by 555 days.

(21) Appl. No.: 10/221,350

(22) PCT Filed: Jul. 12, 2000

(86) PCT No.: PCT/JP00/04668
§ 371 (c)(1),
(2), (4) Date: Sep. 11, 2002

(87) PCT Pub. No.: WO02/05256

PCT Pub. Date: Jan. 17, 2002

(51) Int. Cl.
G09G 5/02 (2006.01)
G06K 9/00 (2006.01)
G03F 3/08 (2006.01)
H04N 1/46 (2006.01)
G03G 15/00 (2006.01)
G06F 15/00 (2006.01)
G09G 5/00 (2006.01)

(52) U.S. Cl. ............... 345/581; 345/593; 345/589; 382/165; 382/167; 358/518; 358/504; 358/521; 399/72

(58) Field of Classification Search ........ 345/589–590, 345/593–594, 597, 601, 581, 204; 382/162–167; 347/115; 348/488, 496, 498, 520, 557, 603; 358/515, 518, 519, 521, 504; 709/200, 203, 709/201, 204, 213; 399/72, 54, 28, 39
See application file for complete search history.

(56) References Cited

U.S. PATENT DOCUMENTS 5,298,993 A 3/1994 Edgar et al.
5,572,444 A * 11/1996 Lentz et al. ............... 702/117
5,715,334 A * 2/1998 Peters ......................... 382/254
5,854,882 A * 12/1998 Wang ........................... 358/1.9
5,870,069 A 2/1999 Choh et al.

(Continued)

FOREIGN PATENT DOCUMENTS

JP A 4-275769 10/1992

(Continued)

OTHER PUBLICATIONS

Schoenbeck, "Electronic Video Systems", pp. 270-271, 1996.

*Primary Examiner*—Wesner Sajous
(74) *Attorney, Agent, or Firm*—Oliff & Berridge, PLC

(57) ABSTRACT

An image processing device (1) provides a client device (3) with a first test pattern image, acquires the results of evaluation concerning distinguishability of the image by human eyes, acquires color expression characteristics of the client device (3) according to the results, provides the client device (3) with a second test pattern image, acquires the results of evaluation concerning appearance of the second test pattern to human eyes, acquires the color balance characteristics of the client device (3), subjects the image data to be provided to color correction on the basis of the characteristics, and provides the client device (3) with the image data, thereby enhancing the color reproductivity of the image data on the client device (3) side.

28 Claims, 17 Drawing Sheets

U.S. PATENT DOCUMENTS

| | | | |
|---|---|---|---|
| 6,151,410 A * | 11/2000 | Kuwata et al. | 382/167 |
| 6,429,886 B2 * | 8/2002 | Ohki | 347/115 |
| 6,693,642 B1 * | 2/2004 | Ogawa | 345/589 |
| 6,788,305 B1 * | 9/2004 | Ohga | 345/589 |
| 6,836,344 B2 * | 12/2004 | Koide et al. | 358/1.9 |
| 2001/0015818 A1 * | 8/2001 | Kawanabe et al. | 358/1.15 |
| 2002/0080168 A1 * | 6/2002 | Hilliard et al. | 345/744 |
| 2002/0161835 A1 * | 10/2002 | Ball et al. | 709/203 |
| 2003/0067636 A1 * | 4/2003 | Kanno et al. | 358/504 |
| 2003/0154484 A1 * | 8/2003 | Plourde et al. | 725/58 |

FOREIGN PATENT DOCUMENTS

| | | |
|---|---|---|
| JP | A 6-35430 | 2/1994 |
| JP | A 7-285241 | 10/1995 |
| JP | A 9-51545 | 2/1997 |
| JP | A 9-160527 | 6/1997 |
| JP | A 9160527 | 6/1997 |
| JP | A 9-312854 | 12/1997 |
| JP | A 11-234709 | 8/1999 |
| JP | A 11-252589 | 9/1999 |
| JP | A 2000-29444 | 1/2000 |
| JP | A 2000-32288 | 1/2000 |
| JP | A 2000-99305 | 4/2000 |
| TW | 317627 | 10/1997 |
| TW | 370761 | 9/1999 |
| TW | 398134 | 7/2000 |

* cited by examiner

FIG. 2

| | | | | | | | |
|---|---|---|---|---|---|---|---|
| 0000 | 01 | 02 | 03 | 3232 | 31 | 30 | 29 |
| 0101 | 02 | 03 | 04 | 3131 | 30 | 29 | 28 |
| 0202 | 03 | 04 | 05 | 3030 | 29 | 28 | 27 |
| 0303 | 04 | 05 | 06 | 2929 | 28 | 27 | 26 |
| 0404 | 05 | 06 | 07 | 2828 | 27 | 26 | 25 |
| 0505 | 06 | 07 | 08 | 2727 | 26 | 25 | 24 |
| 0606 | 07 | 08 | 09 | 2626 | 25 | 24 | 23 |
| 0707 | 08 | 09 | 10 | 2525 | 24 | 23 | 22 |
| 0808 | 09 | 10 | 11 | 2424 | 23 | 22 | 21 |
| 0909 | 10 | 11 | 12 | 2323 | 22 | 21 | 20 |
| 1010 | 11 | 12 | 13 | 2222 | 21 | 20 | 19 |
| 1111 | 12 | 13 | 14 | 2121 | 20 | 19 | 18 |
| 1212 | 13 | 14 | 15 | 2020 | 19 | 18 | 17 |
| 1313 | 14 | 15 | 16 | 1919 | 18 | 17 | 16 |
| 1414 | 15 | 16 | 17 | 1818 | 17 | 16 | 15 |
| 1515 | 16 | 17 | 18 | 1717 | 16 | 15 | 14 |
| 1616 | 17 | 18 | 19 | 1616 | 15 | 14 | 13 |

FIG. 10

| | | | | | | | |
|---|---|---|---|---|---|---|---|
| *0000* | *01* | *02* | *03* | *3232* | *31* | *30* | *29* |
| *0101* | *02* | *03* | *04* | *3131* | *30* | *29* | *28* |
| *0202* | *03* | *04* | *05* | *3030* | *29* | *28* | *27* |
| *0303* | *04* | *05* | *06* | *2929* | *28* | *27* | *26* |
| *0404* | *05* | *06* | *07* | *2828* | *27* | *26* | *25* |
| *0505* | *06* | *07* | *08* | *2727* | *26* | *25* | *24* |
| *0606* | *07* | *08* | *09* | *2626* | *25* | *24* | *23* |
| *0707* | *08* | *09* | *10* | *2525* | *24* | *23* | *22* |
| *0808* | *09* | *10* | *11* | *2424* | *23* | *22* | *21* |
| *0909* | *10* | *11* | *12* | *2323* | *22* | *21* | *20* |
| *1010* | *11* | *12* | *13* | *2222* | *21* | *20* | *19* |
| *1111* | *12* | *13* | *14* | *2121* | *20* | *19* | *18* |
| *1212* | *13* | *14* | *15* | *2020* | *19* | *18* | *17* |
| *1313* | *14* | *15* | *16* | *1919* | *18* | *17* | *16* |
| *1414* | *15* | *16* | *17* | *1818* | *17* | *16* | *15* |
| *1515* | *16* | *17* | *18* | *1717* | *16* | *15* | *14* |
| *1616* | *17* | *18* | *19* | *1616* | *15* | *14* | *13* |

FIG. 11

| | | | | | | | |
|---|---|---|---|---|---|---|---|
| 0000 | 01 | 02 | 03 | 3232 | 31 | 30 | 29 |
| 0101 | 02 | 03 | 04 | 3131 | 30 | 29 | 28 |
| 0202 | 03 | 04 | 05 | 3030 | 29 | 28 | 27 |
| 0303 | 04 | 05 | 06 | 2929 | 28 | 27 | 26 |
| 0404 | 05 | 06 | 07 | 2828 | 27 | 26 | 25 |
| 0505 | 06 | 07 | 08 | 2727 | 26 | 25 | 24 |
| 0606 | 07 | 08 | 09 | 2626 | 25 | 24 | 23 |
| 0707 | 08 | 09 | 10 | 2525 | 24 | 23 | 22 |
| 0808 | 09 | 10 | 11 | 2424 | 23 | 22 | 21 |
| 0909 | 10 | 11 | 12 | 2323 | 22 | 21 | 20 |
| 1010 | 11 | 12 | 13 | 2222 | 21 | 20 | 19 |
| 1111 | 12 | 13 | 14 | 2121 | 20 | 19 | 18 |
| 1212 | 13 | 14 | 15 | 2020 | 19 | 18 | 17 |
| 1313 | 14 | 15 | 16 | 1919 | 18 | 17 | 16 |
| 1414 | 15 | 16 | 17 | 1818 | 17 | 16 | 15 |
| 1515 | 16 | 17 | 18 | 1717 | 16 | 15 | 14 |
| 1616 | 17 | 18 | 19 | 1616 | 15 | 14 | 13 |

IMAGE PROCESSING DEVICE FOR TRANSMITTING COLOR WITH FIDELITY AND PRODUCT SELLING METHOD USING THE SAME

TECHNICAL FIELD

The present invention relates to an image processing device for providing color image data to a remote client device for display by the client device, and in particular to provision of image data in consideration of appearance of colors when displayed by the client device.

BACKGROUND ART

With recent development of Internet-related technologies, the act of accessing a network server from a client device, such as a personal computer, to obtain color image data for display has become exceptionally common. Moreover, with diversification of client devices, a network server can be accessed even from mobile phones, or the like, so that image data is now often displayed using a portable phone equipped with color-image displayable liquid crystal display.

However, where a variety of types of image displaying devices of personal computers are available, displayable color ranges of so-called "full-color display" devices may vary depending on types. Moreover, it is often difficult for EL elements and LCDs, which are often used for portable terminal such as a mobile phone, to faithfully reproduce colors of image data stored in a network server because their color ranges are different from those of CRTs. This difference in color ranges is attributed to relationship between brightness data value of respective primary colors (i.e., red (R), green (G), and blue (B) for direct light) read from image data and brightness of pixels actually lighting on a screen, brightness balance among respective primary colors, and so forth.

Meanwhile, trading in and of various items without actually seeing the items themselves has come to be widely conducted using networks and recording media, including CD-ROM. However, such trading, which is based on images of items displayed on an electronic display device after being obtained via a network or a CD-ROM and so forth, accompanies a problem that a viewer may have different impressions of item colors as depending on the display device in use because of the diversity of display devices, as described above.

Moreover, although colors of image data may be faithfully reproduced under certain conditions, the object of the image data may give different impression when viewed under different conditions. This is attributed to differences in color temperature under different light sources, for example, differences between sunlight and fluorescent light. Specifically, impression of an object which is recognized by a viewer when the light from a light source is reflected on an object and imaged in the viewer's neuron system, may be remarkably different depending on the color temperature of the light source.

In view of the above, the present invention aims to provide an image processing device capable of displaying image data in colors closer to their original colors defined by image data in an electronic display device.

The present invention also aims to provide an image processing device capable of simulating how an object of image data to be displayed in an electronic display device will look, or the appearance of an object of image data, when viewed under a specific condition.

DISCLOSURE OF INVENTION

According to the present invention, there is provided an image processing device for providing image data to a client device to display the image data in the client device, comprising: an information collecting section for sending a test pattern image comprising pattern elements aligned such that gradations are sequentially changed in reference units, to the client device to obtain therefrom information concerning evaluation regarding distinguishing of the gradations of the test pattern image by the human eye as display state information; an estimation section for estimating color expression characteristics of the client device based on the display state information obtained from the client device; and a correction section for applying color correction to image data, based on the estimated color expression characteristics, wherein image data which has been color corrected is provided to the client device.

This configuration makes it possible to apply color correction in advance to image data based on color expression characteristics of the client device which are determined based on an evaluation on distinguishing of gradations, so that image data to provide can be reproduced and displayed in faithful colors.

Preferably, the image processing device according to the present invention may further comprise a database for storing color expression characteristics of client devices so as to be associated with information which identifies the respective client devices.

Preferably, a test pattern image may be available for each primary color and comprises pattern elements which are colored in each primary color alone and aligned such that gradations are sequentially changed in reference units, the information collecting section sequentially sends the test pattern images of the respective primary colors to sequentially obtain the display state information concerning display state of the test pattern images of the respective primary colors in the client device when viewed by the human eye, and the estimation section estimates color expression characteristics of the client device based on the display state information concerning display state of the test pattern images of the respective primary colors in the client device which is determined by the human eye.

Further, preferably, the information collecting section may further send a second test pattern image to the client device to obtain information concerning appearance to the human eye of the second test pattern when displayed by the client device, the second test pattern comprising color samples which are colored so as to have a substantially white or gray color obtained by blending the respective primary colors in a predetermined ratio and arranged according to a predetermined rule determined according to the predetermined ratio, the image processing device further comprises a second estimation section for estimating display intensity of the respective primary colors displayed by the client device, based on the information concerning appearance to the human eye of the second test pattern image when displayed by the client device, and the correction section applies color correction to the image data, based on the estimated color expression characteristics and the display intensity of the respective primary colors estimated by the second estimation section.

This makes it possible to apply color correction relative to primary color displaying characteristics in the client device, in addition to color expression characteristics, so that image data to provide can be reproduced in more faithful colors.

Preferably, display intensity values of the respective primary colors may also be stored so as to be associated with information identifying the respective client devices.

Further, preferably, the information collecting section repetitively may provide a test pattern image having gradations which are changed in smaller reference units until the color expression characteristics of the client device is estimated by the estimation section, to thereby repetitively conduct processing to obtain the display state information.

This makes it possible to obtain precise color expression characteristics information, which enables reliable color reproduction of the image data to provide.

Further, such an image processing device can not only be used to provide image data to a remote client device, but also to simply display electronic image data for faithful color reproduction. That is, according to the present invention, there is provided an image processing device having a display section for controlling displaying of image data, comprising: an information collecting section for displaying in the display section a test pattern image comprising pattern elements aligned such that gradations are sequentially changed in reference units to obtain information concerning evaluation regarding distinguishing of the gradations of the test pattern image by the human eye as display state information; an estimation section for estimating color expression characteristics of the display section based on the obtained display state information; and a correction section for applying color correction to image data, based on the estimated color expression characteristics This makes it possible to apply color correction to a test pattern image before image data stored in a recording media or the like is displayed, so that the image data can be reproduced in faithful colors. It should be noted that the estimated color expression characteristics data can be stored for subsequent use in predetermined processing.

Also in this case, test pattern image may be available for each primary color and comprises pattern elements which are colored in each primary color alone and aligned such that gradations are sequentially changed in reference units, the information collecting section sequentially displays the test pattern images of the respective primary colors to sequentially obtain the display state information concerning display state of the test pattern images for the respective primary colors in the display section, and the estimation section estimates color expression characteristics of the display section based on the display state information concerning display state of the test pattern images of the respective primary colors in the display section.

Preferably, the information collecting section may display a second test pattern image in the display section to obtain information concerning appearance of the second test pattern to the human eye, the second test pattern image comprising color samples which are colored so as to have a substantially white or gray color obtained by blending the respective primary colors in a predetermined ratio and arranged according to a predetermined rule determined according to the predetermined ratio, the image processing device further comprises a second estimation section for estimating display intensity of the respective primary colors displayed in the display section, based on the information concerning appearance of the second test pattern image to the human eye, and the correction section applies color correction to the image data, based on the estimated color expression characteristics and the displaying intensity of the respective primary colors estimated by the second estimation section.

Also in this case, the estimated displaying intensity data for the respective primary colors can be stored for subsequent predetermined processing.

Further, preferably, the information collecting section repetitively may provide a test pattern image having gradations which are changed in smaller reference units until the color expression characteristics of the display section is estimated by the estimation section, to thereby repetitively conduct processing to obtain the display state information.

This enables more precise color reproduction of image data.

According to another aspect of the present invention, there is provided an image processing device for providing image data to a client device to display the image data in the client device, comprising: an information collecting section for sending test image data containing different colors to the client device to obtain therefrom information concerning evaluation of the human eye test image data, wherein color correction is applied in advance to image data to be provided to the client device, based on the obtained information concerning the evaluation made in the client device.

As described above, when distinguishing among different colors, displaying characteristics, and appearance are evaluated and color correction is applied to image data to provide, based on the result of the evaluation, image data can be more faithfully reproduced and displayed by a client device.

The color correction may be applied by creating a color look-up table for each image data based on the information concerning the evaluation.

Alternatively, the color correction may be applied by selecting a color look-up table from among a plurality of color look-up tables provided in advance for each image data, based on the information concerning the evaluation.

According to yet another aspect of the present invention, there is provided an image processing device for displaying image data, comprising: an information collecting section for displaying test image data containing different colors to obtain information concerning evaluation of the test image data, wherein color correction is applied in advance to image data, based on the obtained information concerning the evaluation.

With this arrangement, when distinguishing among different colors, display characteristics, and appearance to the human eye are evaluated and color correction is applied to image data, based on the result of the evaluation, image data stored in, for example, a memory media can be reproduced in more faithful colors.

Also in this case, the color correction is applied by creating a color look-up table for each image data based on the information concerning the evaluation.

Alternatively, the color correction is applied by selecting a color look-up table from among a plurality of color look-up tables provided in advance for each image data, based on the information concerning the evaluation.

According to yet another aspect of the present invention, there is provided an image processing device for providing image data to a client device to display the image data in the client device, comprising: an information collecting section for sending a test pattern image comprising an image element with a predetermined gradation and a plurality of image elements with gradations different from the predetermined gradation which are arranged relative to the image element having the predetermined level of gradation so as to contact to one another, to the client device to obtain therefrom information concerning evaluation regarding distinguishing of the image elements of the test pattern image by the human eye as display state information; and a correction section for applying color correction to image data to provide, based on the obtained display state information of the client device, wherein image data which has been color corrected is provided to the client device.

This makes it easier to evaluate distinguishing of gradations by human eyes, so that image data can be reproduced in more faithful colors.

Preferably, levels of gradations of image elements which are arranged so as to contact with an image element with a predetermined level of gradation may include at least a level of gradation which is different from the predetermined level of gradation by one reference unit, and additionally levels of gradations which are further different in reference units.

According to yet another aspect of the present invention, there is provided an image processing device having a display section for displaying image data, comprising: an information collecting section for displaying in the display section a test pattern image comprising an image element with a predetermined gradation and a plurality of image elements with gradations different from the predetermined gradation which are arranged relative to the image element having the predetermined level of gradation so as to contact to one another to obtain information concerning evaluation regarding distinguishing of the image elements of the test pattern image by the human eye as display state information; and a correction section for applying color correction to image data, based on the obtained display state information.

Also in such a case, preferably, levels of gradations of image elements which are arranged so as to contact with an image element with a predetermined level of gradation may include at least a level of gradation which is different from the predetermined level of gradation by one reference unit, and additionally levels of gradations which are further different in reference units.

According to yet another aspect of the present invention, there is provided an image processing device for providing image data to a client device to display the image data in the client device, comprising: an obtaining section for obtaining information specifying a light source from the client, wherein color correction is applied to image data, based on the obtained information specifying a light source such that image data which has been color corrected is provided to the client device.

This makes it possible to correct appearance of image data based on difference of light sources, so that image data of, for example, products can be reproduced in colors in consideration of the condition of a light source under which the product will be actually used.

It should be noted that colors may be further corrected according to not only a light source but also information which specifies a condition, such as colors and reflectance of walls, and information which concerns influence of light scattered in air, and so forth. This makes it possible to reproduce a visible condition for image data, which is more close to that when the concerned product is actually used.

In the present invention in which distinguishing of gradations is evaluated and color expression characteristics are estimated based on the evaluation, preferably, an obtaining section for obtaining information specifying a light source from the client may be further provided, and the color correction may be applied based on the estimated color expression characteristics and the information specifying a light source.

Likewise, also when image data is locally displayed, preferably, an obtaining section for obtaining information specifying a light source may be further provided, and the correction section may apply color correction based on the estimated color expression characteristics and the information specifying a light source.

According to yet another aspect of the present invention, there is provided an image processing device for providing image data to a client device to display the image data with the client device, comprising: an information collecting section for sending a first test pattern image comprising pattern elements aligned such that gradations are sequentially changed in reference units, to the client device to obtain therefrom information concerning evaluation regarding distinguishing of the gradations of the test pattern image by the human eye as first display state information, and also for sending a second test pattern image to the client device to obtain information concerning appearance of the second test pattern to the human eye in the client device as second display state information, the second test pattern image comprising color samples which are colored so as to have a substantially white or gray color obtained by blending the respective primary colors in a predetermined ratio and arranged according to a predetermined rule determined according to the predetermined ratio; an obtaining means for obtaining information specifying a light source from the client device; a first estimation section for estimating color expression characteristics of the client device based on the first display state information; a second estimation section for estimating displaying intensity of the primary colors displayed in the client device, based on the second display state information; and a correction section for applying color correction to the image data to provide, based on the estimated color expression characteristics, the estimated displaying intensity of the primary colors, and the obtained information specifying a light source, wherein image data which has been color corrected is provided to the client device.

This makes it possible to apply color correction to image data in consideration of the influence of a light source while enhancing color reproductivity of the image data.

According to yet another aspect of the present invention, there is provided an image processing device for providing product image data to a client device via an electronic communication network to display the product image data in the client device, comprising: an information collecting section for providing, prior to provision of the product image data, test image data containing different colors to obtain information concerning evaluation regarding the test image data determined by the human eye in the client device; a correction section for applying color correction to the product image data based on the information concerning the evaluation determined in the client device; and a transmission section for sending product image data which has been color corrected to the client device.

This makes it possible to faithfully reproduce colors of product image data in a client device.

Here, preferably, an obtaining section for obtaining information specifying a light source from the client device may be further provided, and the correction section may apply color correction to the product image data based on the information concerning the evaluation determined in the client device and the information specifying a light source.

With this arrangement, selection of a suitable light source according to an actual use of the product enables simulation of appearance of colors of the product under condition in which it will be actually used.

According to yet another aspect of the present invention, there is provided an image processing device for reading out designated product image data from a storage media which stores product image data to display the read product image data in a display section, comprising: an information collecting section for displaying, prior to displaying of the product image data, test image data containing different colors in the display section to obtain information concerning evaluation regarding the test image data determined by the human eye; and a correction section for applying color correction to the product image data, based on the information concerning the evaluation regarding the test image data displayed in the display section, wherein product image data which has been color corrected is displayed in the display section.

Here, preferably, obtaining means for obtaining information specifying a light source may be further provided, and the correction section may apply color correction to the product image data based on the information concerning the evaluation regarding the test image data displayed in the display section and the information specifying a light source.

According to yet another aspect of the present invention, there is provided a method for providing image data, comprising the steps of: sending a test pattern image comprising pattern elements aligned such that gradations are sequentially changed in reference units, to the client device to obtain therefrom information concerning evaluation regarding distinguishing of the gradations of the test pattern image by the human eye as display state information; estimating color expression characteristics of the client device based on the display state information obtained from the client device; applying color correction to image data, based on the estimated color expression characteristics; and providing image data which has been color corrected to the client device.

According to yet another aspect of the present invention, there is provided a method for displaying image data, comprising the steps of: displaying test image data containing a plurality of colors to obtain information concerning appearance of the test image data to the human eye; and applying color correction in advance to the image data, based on the obtained information concerning appearance.

According to yet another aspect of the present invention, the present invention may be realized in the form of software, and a computer readable recording media storing an image data providing program which comprises: a module for sending a test pattern image comprising pattern elements aligned such that gradations are sequentially changed in reference units, to the client device to obtain therefrom information concerning evaluation regarding distinguishing of the gradations of the test pattern image by the human eye as display state information; a module for estimating color expression characteristics of the client device based on the display state information obtained from the client device; a module for applying color correction to image data, based on the estimated color expression characteristics; and a module for providing image data which has been color corrected to the client device.

According to yet another aspect of the present invention, there is provided a computer readable recording media storing an image displaying program which comprises: a module for displaying test image data containing different colors to obtain information concerning appearance of the test image data to the human eye; and a module for applying color correction in advance to the image data to display, based on the obtained information concerning appearance.

According to yet another aspect of the present invention, there is provided a computer readable recording media storing test pattern image data comprising aligned image elements having gradations which are sequentially changed in reference gradation units.

According to yet another aspect of the present invention, there is provided a computer readable recording media storing test pattern image data comprising an image element with a predetermined gradation and a plurality of image elements with gradations different from the predetermined gradation which are arranged relative to the image element having the predetermined level of gradation so as to contact to one another.

According to yet another aspect of the present invention, there is provided means for creating a test pattern image, comprising the steps of: creating a basic image element having a predetermined level of gradation; creating n-number of image elements having a plurality of levels of gradations which are different from the predetermined level of gradation, n being an integer from 1 to n; and arranging each of the n-number of image elements relative to the basic image element such that the n number of image elements are in contact to one another.

By using test pattern image data, whether generated or stored in a recording media, for evaluation concerning distinguishing of gradations, evaluation can be simplified, which in turn enables more appropriate color correction.

BRIEF DESCRIPTION OF DRAWINGS

FIG. 2 is a diagram explaining a specific example of a first test pattern image according to the present invention;

FIG. 10 is a diagram schematically showing an example of displaying a first test pattern image;

FIG. 11 is a diagram schematically showing another example of displaying a first test pattern image;

FIG. 12 is a diagram schematically showing still another example of displaying a first test pattern image;

BEST MODE FOR CARRYING OUT THE INVENTION

First Embodiment

Figure 1:
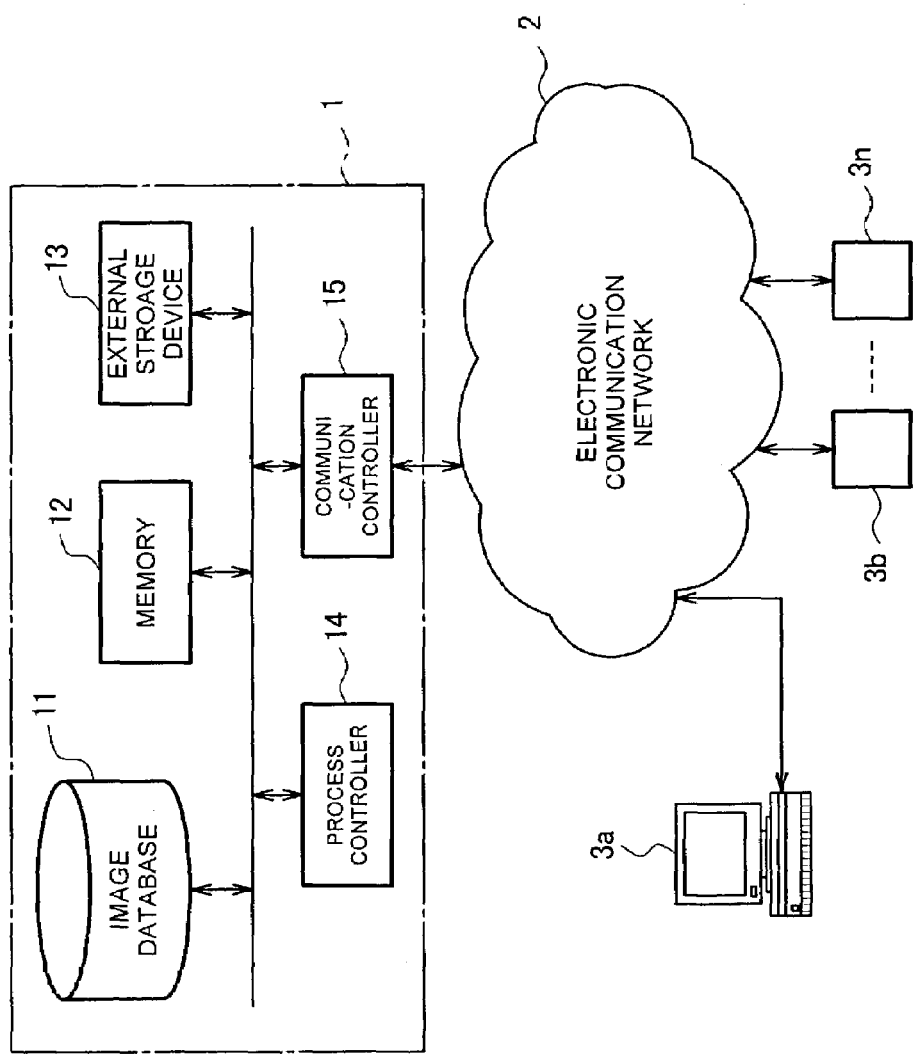
FIG. 1 is a diagram showing a preferred embodiment of the present invention.

The present invention will be described in detail with reference to the attached drawings. In a best mode for carrying out the invention, as shown in FIG. 1, an image processing device 1 is connected to a plurality of client devices 3a, 3b, . . . via an electronic communication network 2. The image processing device 1 comprises an image database 11, a memory 12, an external storage device 13, a process controller 14, and a communication controller 15.

The image database 11 of the image processing device 1 stores image data to be provided to the client devices 3 via the electronic communication network 2, and test image data to be used to obtain information concerning display state of the client devices 3. The test image data includes a plurality of test pattern images which are used to determine brightness characteristics as color expression characteristics and to determine displaying intensity of the respective primary colors as color balance characteristics. These test patterns include a (first) test pattern and a second test pattern. The first test pattern constitutes of aligned pattern elements colored with gradations changing in reference units. The second test pattern constitutes of color sample data (color samples) which are colored in substantially white or gray and arranged according to a certain rule, wherein the color of each color sample is obtained by blending the respective primary colors at predetermined ratio, and the certain rule is determined according to the predetermined ratio.

Figure 2:
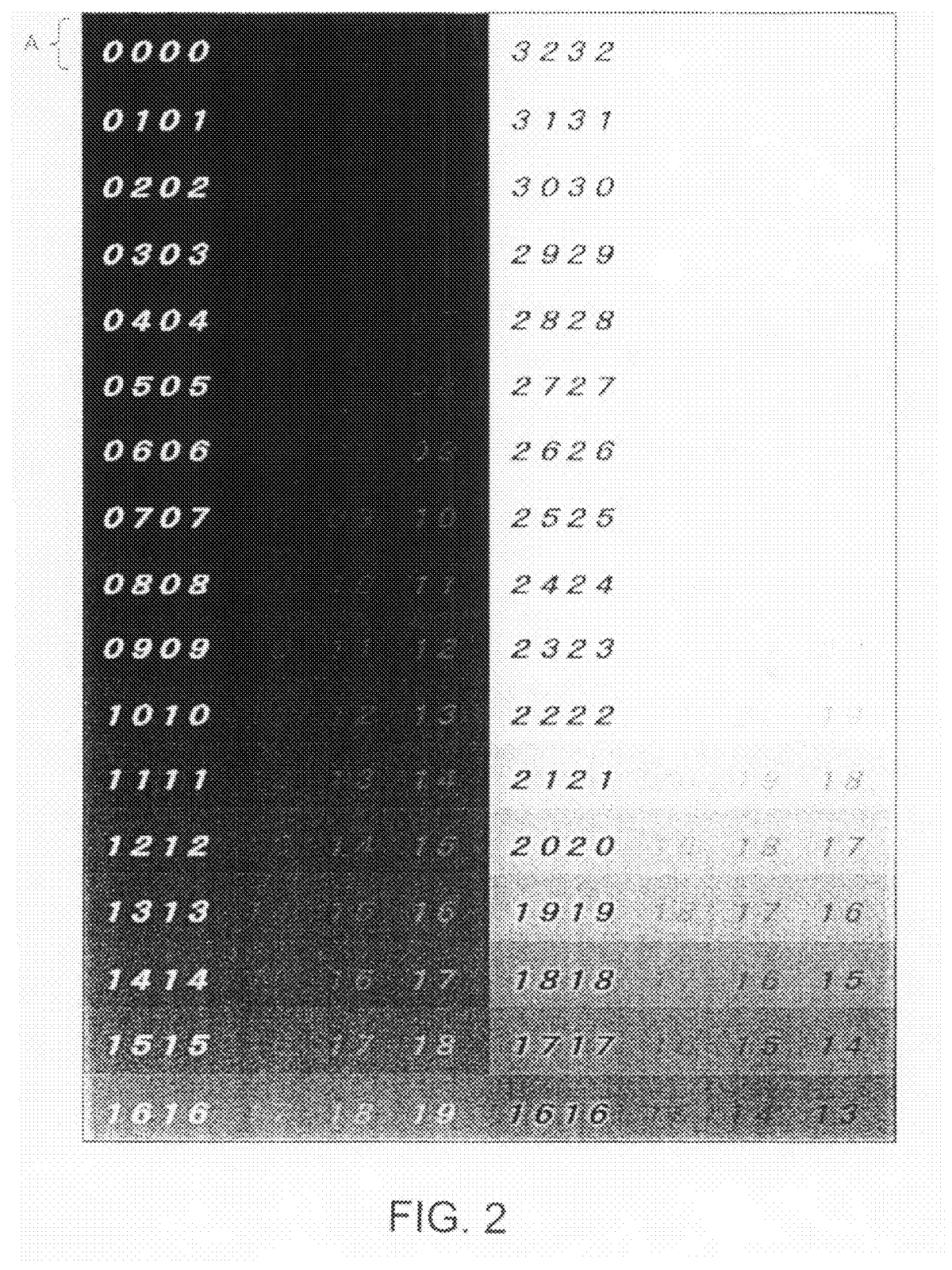

Example first and second test pattern images will be described. As shown in FIG. 2, the first test pattern image constitutes of sequentially aligned rectangular regions (A) colored with gradations changing in reference units. Each rectangular region has an identifier for identifying its own region and image elements (numbers here) which are colored with gradations at levels sequentially changing from that of its own region by, for example, one, two, and three reference gradation units. These rectangular regions having a plurality of image elements colored with gradations at adjacent levels correspond to the pattern elements of the present invention. Using these pattern elements, an evaluation is made as to whether or not gradations at adjacent levels can be distinguished (distinguishability) by human eye, and, based on this evaluation, an amount of change in brightness of an actual display pixel relative to an amount of change in a brightness data value can be estimated.

It should be noted that a first test pattern image is prepared for each primary color, so that three test patterns are stored in the image database 11, wherein each test pattern is colored with brightness of the primary colors progressing from 0 (black) to the maximum (pure) in reference gradation units.

The second test pattern constitutes of desirably arranged graphic elements colored at least in substantially white or gray. The color of each graphic element is obtained by blending the primary colors respectively with certain levels of gradations within the maximum brightness (white) range or a predetermined intermediate gradation range (gray), and the colors of the respective graphic elements are determined based on slightly different combinations of gradation levels for the primary colors. Each graphic element has an identifier (code) which corresponds to its own combination of brightness signals, so that a viewer at a client device 3 is asked to input the identifier of a graphic element which appears white or gray to him, to thereby collect information for use in color balance correction to the respective primary colors.

Figure 3:
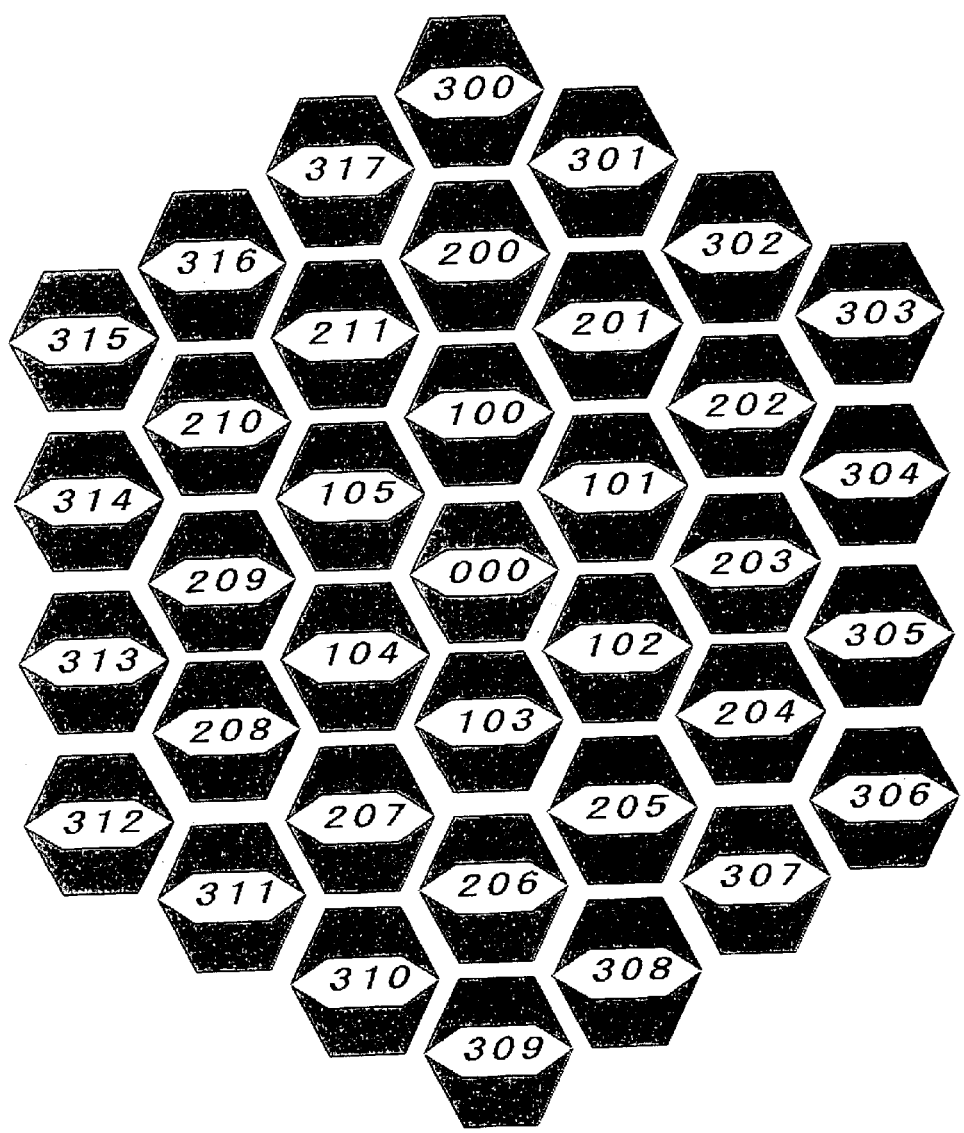
FIG. 3 is a diagram explaining a specific example of a second test pattern image according to the present invention.

Specifically, as shown in FIG. 3, an exemplary second test pattern may comprise graphic elements consisting of two combined hexagons regularly placed in a honeycomb arrangement, with one of the hexagons being slightly colored white, and the other gray. The white and gray colors of the same graphic element are determined based on identical combination of gradation levels for the primary colors. Each graphic element has a three-digit identifier which corresponds to its own combination of brightness signals for the primary colors.

Here, Tables 1 and 2 show combinations of brightness of the respective primary colors with respect to a pixel which displays hexagons "000" to "317", which are slightly colored in substantially white or gray. The brightness values in Table 1 or 2 are determined in accordance with a system of 257 levels from brightness 0 to 256.

The white portion of the graphic element "000", which is located at the center of the test pattern, for example, corresponds to red, green, and blue, all having the maximum brightness 256, while the gray portion of the same corresponds to red, green, and blue, all having brightness 128, or a half of the maximum (this gray is referred to as "50% gray" as having the brightness half of the maximum). Here, "50% gray" is only an example, and any proportion of grayness, such as 25%, 60%, and so forth, of the maximum brightness, may also be applicable.

TABLE 1

| | 50% GRAY | | |
|---|---|---|---|
| NUMBERS | RED BRIGHTNESS | GREEN BRIGHTNESS | BLUE BRIGHTNESS |
| 000 | 128 | 128 | 128 |
| 100 | 128 | 124 | 124 |
| 101 | 128 | 120 | 128 |
| 102 | 124 | 124 | 128 |
| 103 | 120 | 128 | 128 |
| 104 | 124 | 128 | 124 |
| 105 | 128 | 128 | 120 |
| 200 | 128 | 120 | 120 |
| 201 | 128 | 116 | 124 |
| 202 | 128 | 112 | 128 |
| 203 | 124 | 116 | 128 |
| 204 | 120 | 120 | 128 |
| 205 | 116 | 124 | 128 |
| 206 | 112 | 128 | 128 |
| 207 | 116 | 128 | 124 |
| 208 | 124 | 128 | 124 |
| 209 | 124 | 128 | 116 |
| 210 | 128 | 128 | 112 |
| 211 | 128 | 124 | 116 |
| 300 | 128 | 116 | 116 |
| 301 | 128 | 112 | 120 |
| 302 | 128 | 108 | 124 |
| 303 | 128 | 104 | 128 |
| 304 | 124 | 108 | 128 |
| 305 | 120 | 112 | 128 |
| 306 | 116 | 116 | 128 |
| 307 | 112 | 120 | 128 |
| 308 | 108 | 124 | 128 |
| 309 | 104 | 128 | 128 |
| 310 | 108 | 128 | 124 |
| 311 | 112 | 128 | 120 |
| 312 | 116 | 128 | 116 |
| 313 | 120 | 128 | 112 |
| 314 | 124 | 128 | 108 |
| 315 | 128 | 128 | 104 |
| 316 | 128 | 124 | 108 |

TABLE 1-continued

50% GRAY

| NUMBERS | RED BRIGHTNESS | GREEN BRIGHTNESS | BLUE BRIGHTNESS |
|---|---|---|---|
| 317 | 128 | 120 | 112 |

TABLE 2

WHITE

| NUMBERS | RED BRIGHTNESS | GREEN BRIGHTNESS | BLUE BRIGHTNESS |
|---|---|---|---|
| 000 | 256 | 256 | 256 |
| 100 | 256 | 248 | 248 |
| 101 | 256 | 240 | 256 |
| 102 | 248 | 248 | 256 |
| 103 | 240 | 256 | 256 |
| 104 | 248 | 256 | 248 |
| 105 | 256 | 256 | 240 |
| 200 | 256 | 240 | 240 |
| 201 | 256 | 232 | 248 |
| 202 | 256 | 224 | 256 |
| 203 | 248 | 232 | 256 |
| 204 | 240 | 240 | 256 |
| 205 | 232 | 248 | 256 |
| 206 | 224 | 256 | 256 |
| 207 | 232 | 256 | 248 |
| 208 | 248 | 256 | 248 |
| 209 | 248 | 256 | 232 |
| 210 | 256 | 256 | 224 |
| 211 | 256 | 248 | 232 |
| 300 | 256 | 232 | 232 |
| 301 | 256 | 224 | 240 |
| 302 | 256 | 216 | 248 |
| 303 | 256 | 208 | 256 |
| 304 | 248 | 216 | 256 |
| 305 | 240 | 224 | 256 |
| 306 | 232 | 232 | 256 |
| 307 | 224 | 240 | 256 |
| 308 | 216 | 248 | 256 |
| 309 | 208 | 256 | 256 |
| 310 | 216 | 256 | 248 |
| 311 | 224 | 256 | 240 |
| 312 | 232 | 256 | 232 |
| 313 | 240 | 256 | 224 |
| 314 | 248 | 256 | 216 |
| 315 | 256 | 256 | 208 |
| 316 | 256 | 248 | 216 |
| 317 | 256 | 240 | 224 |

Either the gray or the white graphic element may be used, however, experimental results show that substantially white graphic elements are often superior in terms of distinguishability of slight color variations. However, because a display screen entirely covered with substantially white graphic elements alone may be excessively bright and thus dazzling, preferably, combined graphic elements of substantially white and gray may be presented while asking the viewer to select one which appears pure white or gray to him.

Substantially white portions of the six graphic elements surrounding "000", namely, "100", "101", "102", "103", "104", and "105", correspond to blended primary colors respectively at brightness levels determined through subtraction of six different combinations, namely, "0, 0, 16", "0, 16, 0", "16, 0, 0", "0, 8, 8", "8, 0, 8", and "8, 8, 0", from the maximum "256". The substantially gray portions of the same correspond to colors with brightness half of that of the associated substantially white portions.

The substantially white portions of the twelve graphic elements "200" to "211" correspond to blended primary colors at respective brightness levels determined through subtraction of twelve different brightness level combinations, including three combinations (e.g., "0, 0, 32"), another three (e.g., "0, 16, 16"), and six (e.g., "0, 8, 24"), from the maximum brightness levels. The substantially gray portions of the same correspond to colors with a brightness half of that of the associated substantially white portions.

The substantially white portions of the eighteen graphic elements "300" to "317" correspond to blended primary colors at respective brightness levels determined through subtraction of eighteen different brightness level combinations, including three combinations (e.g., "0, 0, 48"), six (e.g., "0, 16, 32"), another three (e.g., "0, 24, 24"), and another six (e.g., "0, 8, 40"), from the maximum brightness levels. The substantially gray portions of the same correspond to colors with brightness half of that of the associated substantially white portions.

It should be noted that the brightness level of at least one of the three primary colors to be blended into a substantially white color is set at the maximum 256.

When this second test pattern is displayed in a client device 3 and the identifier of a graphic element which appears pure white or gray to the human eye is obtained, brightness balance among the three primary colors in the client device 3 can be estimated.

Figure 4:
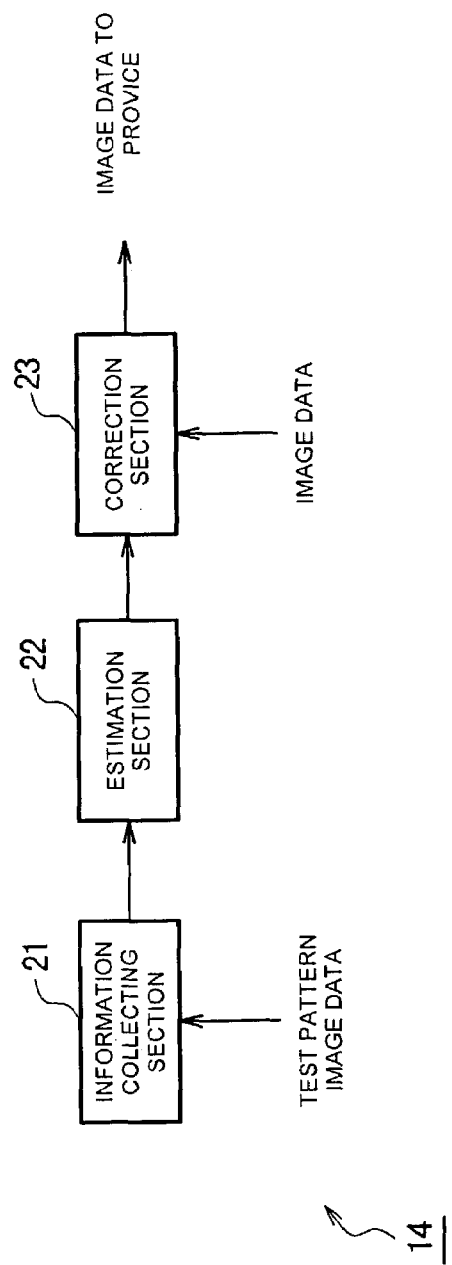
FIG. 4 is a block diagram depicting the interior of a process controller 14 in a preferred embodiment of the present invention.

The memory 12 serves as a work memory of the process controller 14. The external storage device 13 reads out data from a computer readable recording media, such as a floppy disk or a magneto-optical disk, on which data is magnetically or optically recorded. As shown in FIG. 4, the process controller 14 basically comprises an information collecting section 21 for collecting information concerning display state of the client device 3, an estimation section 22 for estimating display characteristics (color expression characteristics and color balance characteristics) of the client device 3, and a correction section 23 for applying color correction to image data based on the display characteristics.

The process controller 14 functions as a Web server (an HTTP server) by, specifically, receiving an input image data request transmitted from a client device 3 via an electronic communication device and received in the communication controller 15, reading out the requested image data from the image database 11 to store in the memory 12, and checking whether or not display characteristics information for that client device 3 is available. If such information is not available, the process controller 14 activates the information collecting section 21. If it is available, on the other hand, the process controller 14 controls the correction section 23 so as to apply color correction to the image data stored in the memory 12, based on the available display characteristics information, and then instructs the communication control section 15 so as to provide color corrected image data to the client device 3 via the electronic communication network 2.

Figure 5:
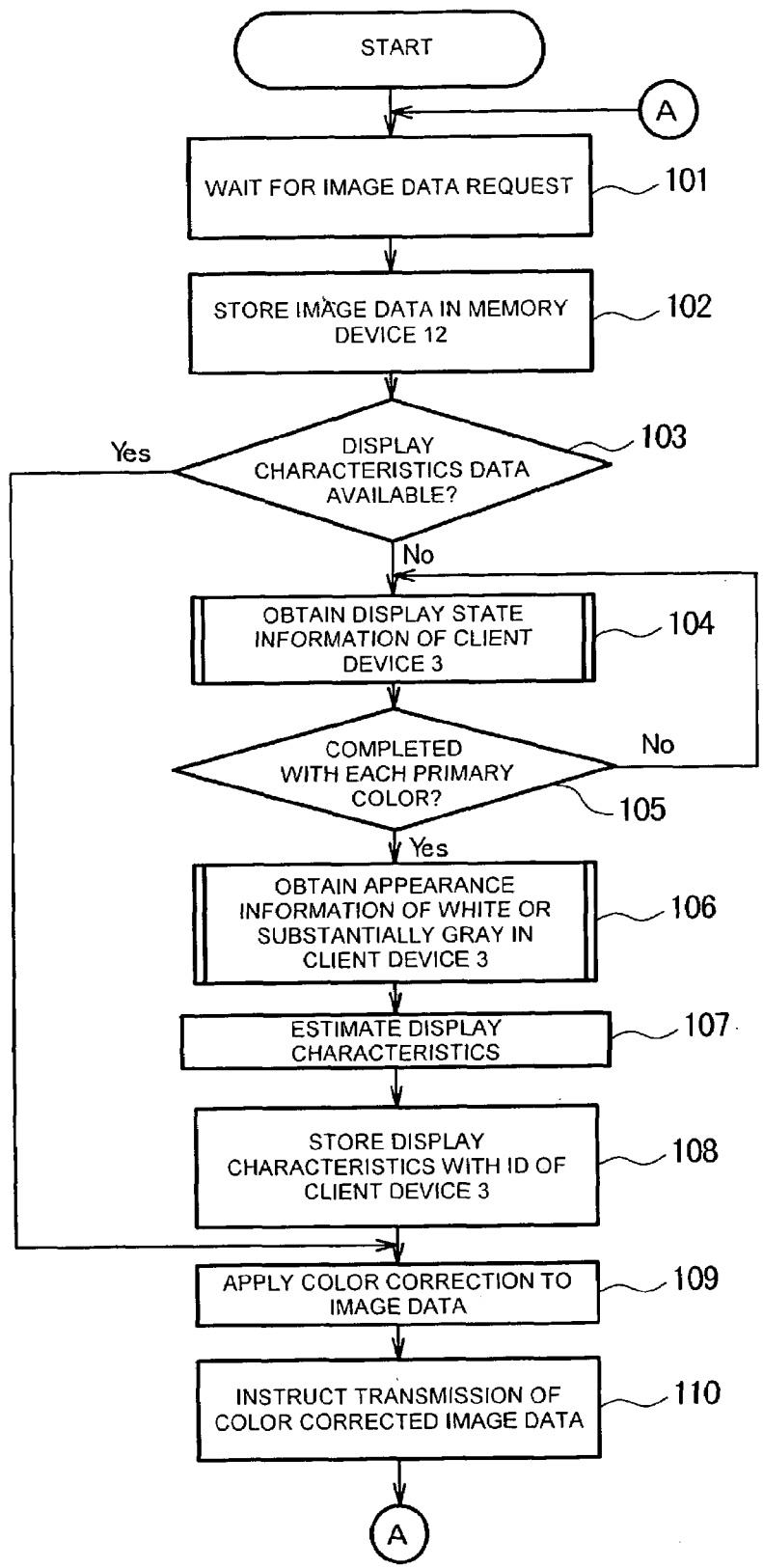
FIG. 5 is a flowchart showing processing in the process controller 14 in the preferred embodiment of the present invention.

The process controller 14 is realized specifically as a software module to be executed by the Central Processing Unit (CPU). The software module may be read out from a computer readable recording media by, for example, the external storage device 13. That is, as shown in FIG. 5, the process controller 14 waits for a request for image data (step 101) and, upon receipt of a request for image data, reads out the requested image data from the image database 11, and stores it in the memory 12 (step 102). The process controller 14 then checks whether or not display characteristics data for use in color correction with respect to the client device 3 which has sent the image data request is stored in the memory 12 (step 103). If such display characteristic data for color correction is not stored in the memory 12 ("No"), the process controller 14 activates the information collecting section 21 to initiate processing for obtaining a result of evaluation in the client 3 using the first test pattern image as to whether or not adjacent levels of gradations in the first test pattern are distinguishable by human eyes (display state information) (step 104). Processing for obtaining display state information will be described later in greater detail.

Next, the process controller 14 checks whether or not the processing at step 104 has been completed for all of the three primary colors (step 105). When the processing has not yet been completed ("No"), the processing at the step 104 is repeated using the first test pattern image of a color yet to be evaluated. When it has been completed ("Yes" at step 105), on the other hand, the process controller 14 proceeds processing for obtaining information concerning appearance of white or gray color to human eyes in the client device 3 using the second test pattern (step 106). Then, the process controller 14 activates the estimation section 22 to estimate color expression characteristics and brightness balance of the client device 3 as display characteristics based on the display state information concerning the primary colors in the client device 3 and the information concerning appearance of white or gray to the human eye (step 107), and stores the display characteristics in the memory 12 in a manner of associating it with information identifying the relevant client device 3 (obtained from header of data exchanged over the electronic communication network 2) (step 108).

Thereafter, the process controller 14 applies color correction to the image data which have been stored in the memory 12 at step 102, based on the display characteristics of the client device 3 which has been estimated at step 106 (step 109), and instructs the communication controller 15 so as to send image data with color corrected to the client device 3 (step 110) before the process returns to step 101 to continue (A).

In the above, when the display characteristics data for color correction is found stored in the memory section 12 at step 103 ("Yes"), the process jumps to step 109, where the process controller 14 activates the correction section 23 so as to apply color correction to the image data based on the display characteristics data stored in the memory 12, and the image data with color corrected is sent to the client device 3 at step 110.

Figure 6:
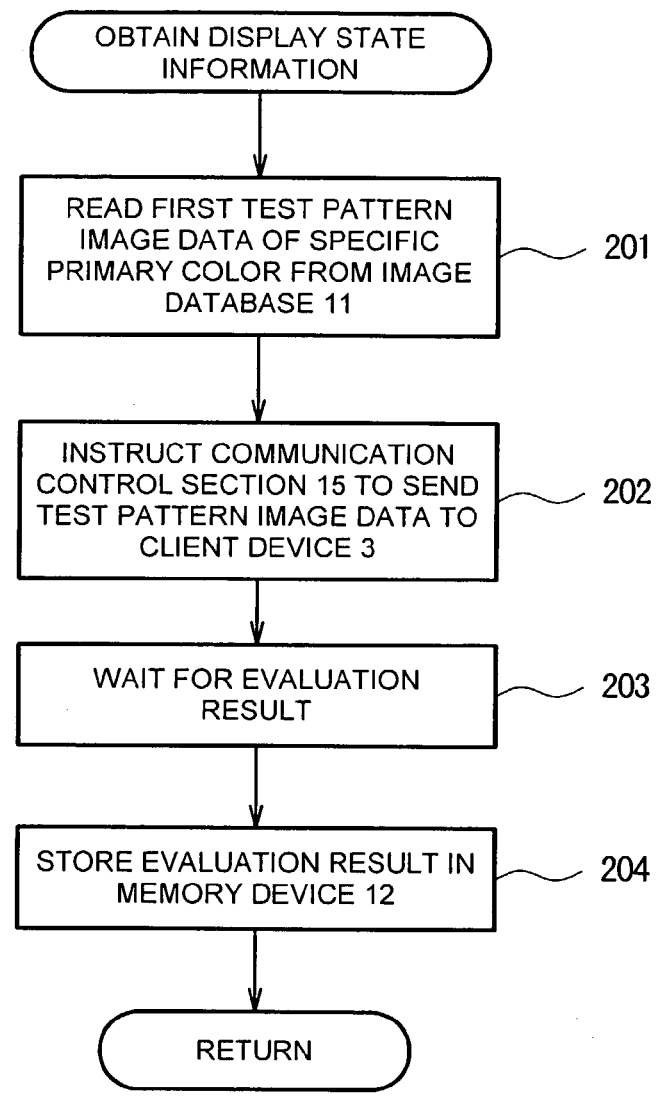
FIG. 6 is a flowchart showing processing for obtaining display state information from the process controller 14 in the preferred embodiment of the present invention.

Next described will be processing at step 104, in which the process controller 14 obtains information concerning display state of the client device 3. As shown in FIG. 6, in the processing at step 104, the process controller 14 reads out a first test pattern image data for a specific primary color (any of red, green, and blue) from the image database 11 (step 201), and instructs the communication controller 15 so as to send the test pattern image data to the client device 3 (step 202). Then, the process controller 14 waits for receipt of a result of evaluation, provided from the client device 3, concerning whether or not adjacent levels of gradations in the test pattern image can be distinguished by human eyes (step 203). Upon receipt of the result, the process controller 14 stores the result as display state information in the memory 12 (step 204) before the process returns to step 105 to continue.

Further, the process controller 14 obtains information concerning how the white or gray color will look to the human eye (appearance of white or gray color) when displayed by the client device 3. Specifically, the process controller 14 reads out the second test pattern image data from the image database 11, and instructs the communication controller 15 so as to send the test pattern image to the client device 3. Then, the process controller 14 waits for receipt of information, provided from the client device 3, specifying the graphic element which appears most white or gray. Upon receipt of the information, the process controller 14 stores the received information in the memory 12 as information concerning appearance of the white or gray color in the client device 3 before the process returns to step 107 to continue.

The communication controller 15, having been instructed by the process controller 14, sends data to the client device 3 over the electronic communication network 2. The communication controller 15 also forwards received data which has been transmitted over the electronic communication network 2, to the process controller 14.

The electronic communication network 2 may be a computer network such as the Internet. The client device 3 may be a general personal computer which may be operated according to an operating system such as Windows (trademark), on which general Web browser software such as Netscape Navigator (trademark) may run. The client device 3 comprises a graphic card device having specific color expression characteristics, and a display device (such as a CRT, a liquid crystal display, and an EL display) to be connected to the graphic card device.

The client device 3 may be a portable terminal device, such as a portable telephone having a wireless application protocol, or WAP, which allows access therethrough to an electronic communication network. Such a portable terminal device may generally comprise a liquid crystal display which has predetermined color expression characteristics.

[Principles in Characteristics Estimation and Correction]

Next described will be the principle of estimation and image data correction based on display characteristics, including color expression characteristics and brightness balance, based on information concerning distinguishability of adjacent levels of gradations by human eyes in the client device 3 (display state information) and information concerning appearance of white or gray color to the human eye in the client device 3.

In a graphic card or display device in the client device 3, generally, brightness of the primary colors (red (R), green (G), and blue (B)) of each pixel is adjusted to create the color nuance of each pixel. Preferably, brightness of each primary color is proportional to brightness information as image data. That is, preferably, brightness of one primary color, for example, red, on a display is adjusted to be of r/N of its maximum brightness when a red data value indicates r out of N-stages (FIG. 7).

Figure 8:
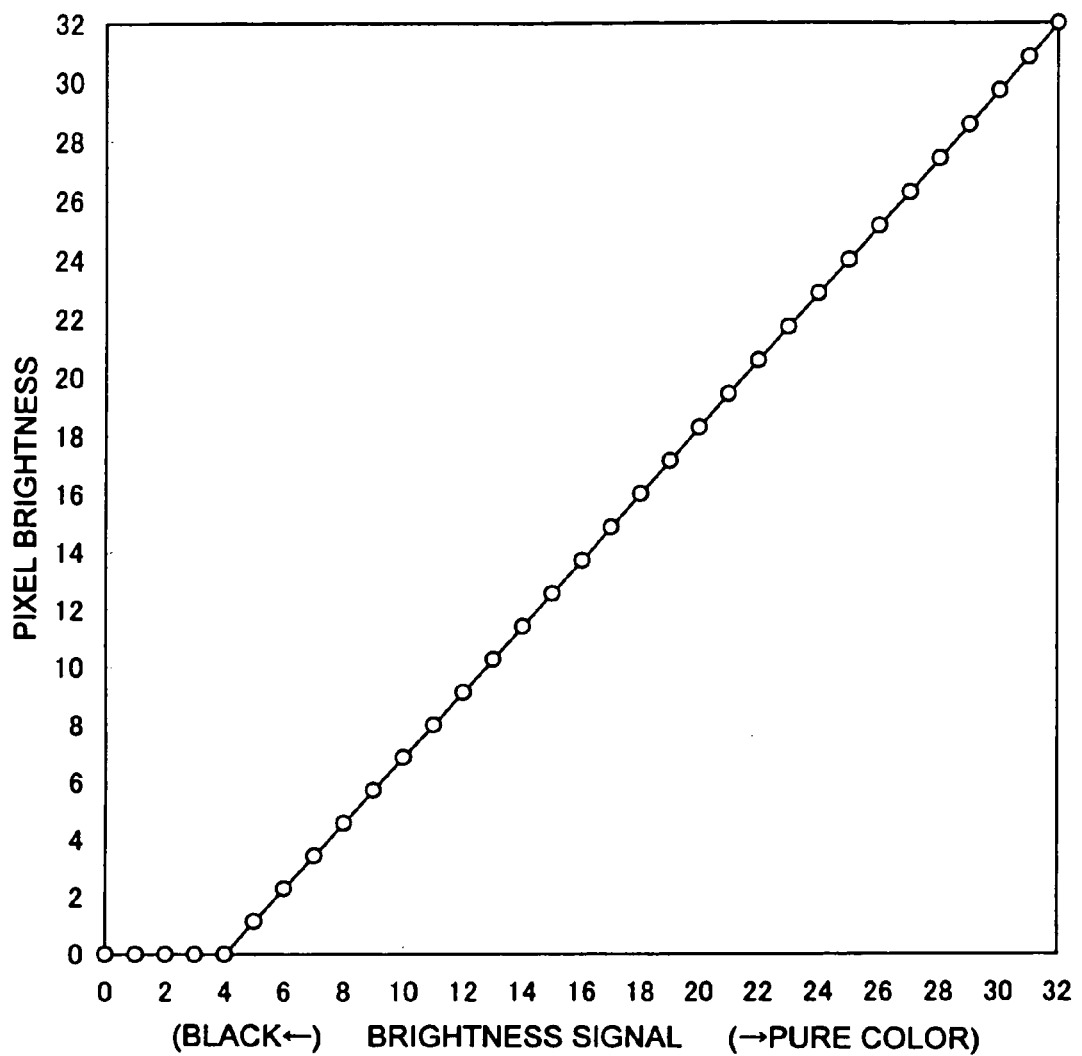
FIG. 8 is a diagram showing another example of relationship between a brightness signal and pixel brightness.
Figure 9:
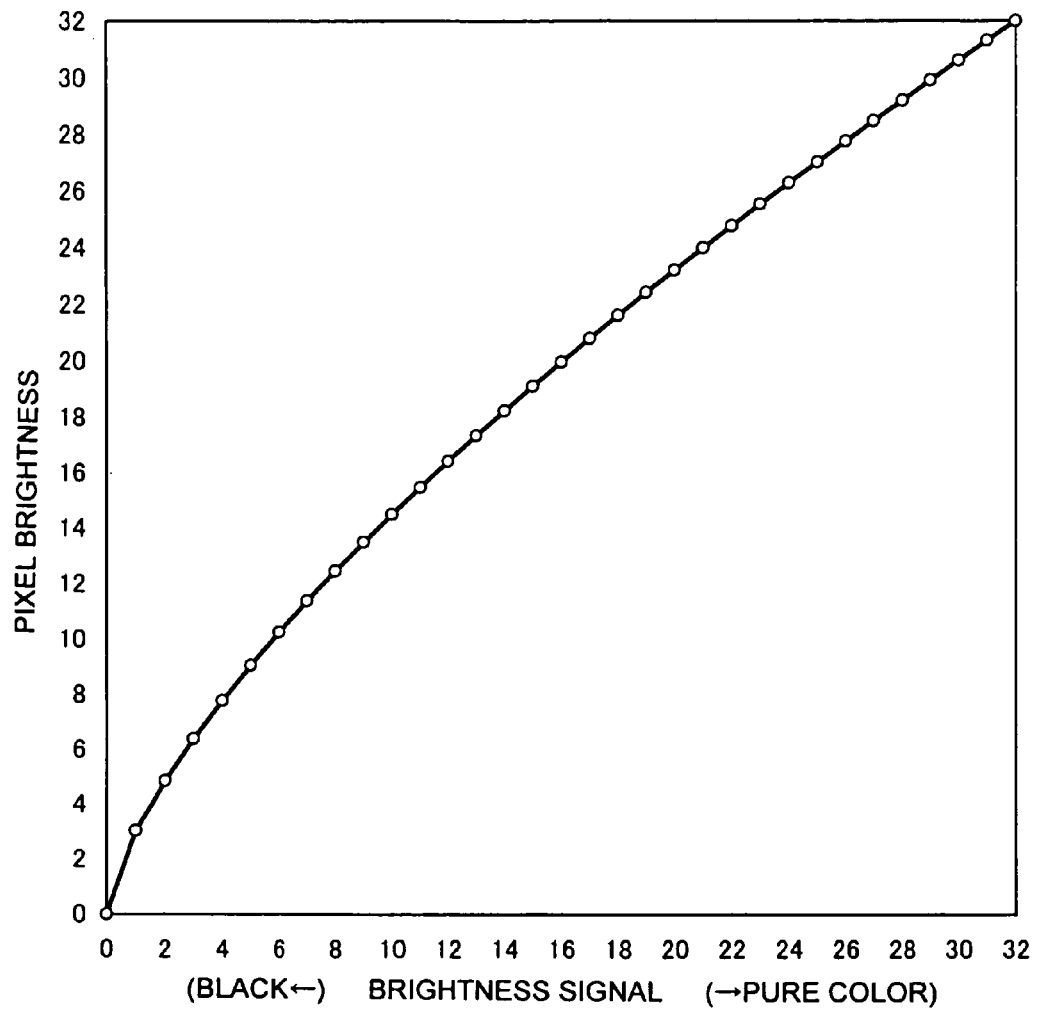
FIG. 9 is a diagram showing still another example of relationship between a brightness signal and pixel brightness.

However, when a small brightness data value for a certain pixel is changed only slightly, (i.e., dark colors with poor expressiveness), actual brightness of the pixel may remain 0 over some small brightness data values, and may thereafter begin increasing rather suddenly, as shown in FIG. 8. Alternatively, proportionality may not be preserved and a curved graph instead results (when a gamma value is not 1), as shown in FIG. 9.

Figure 7:
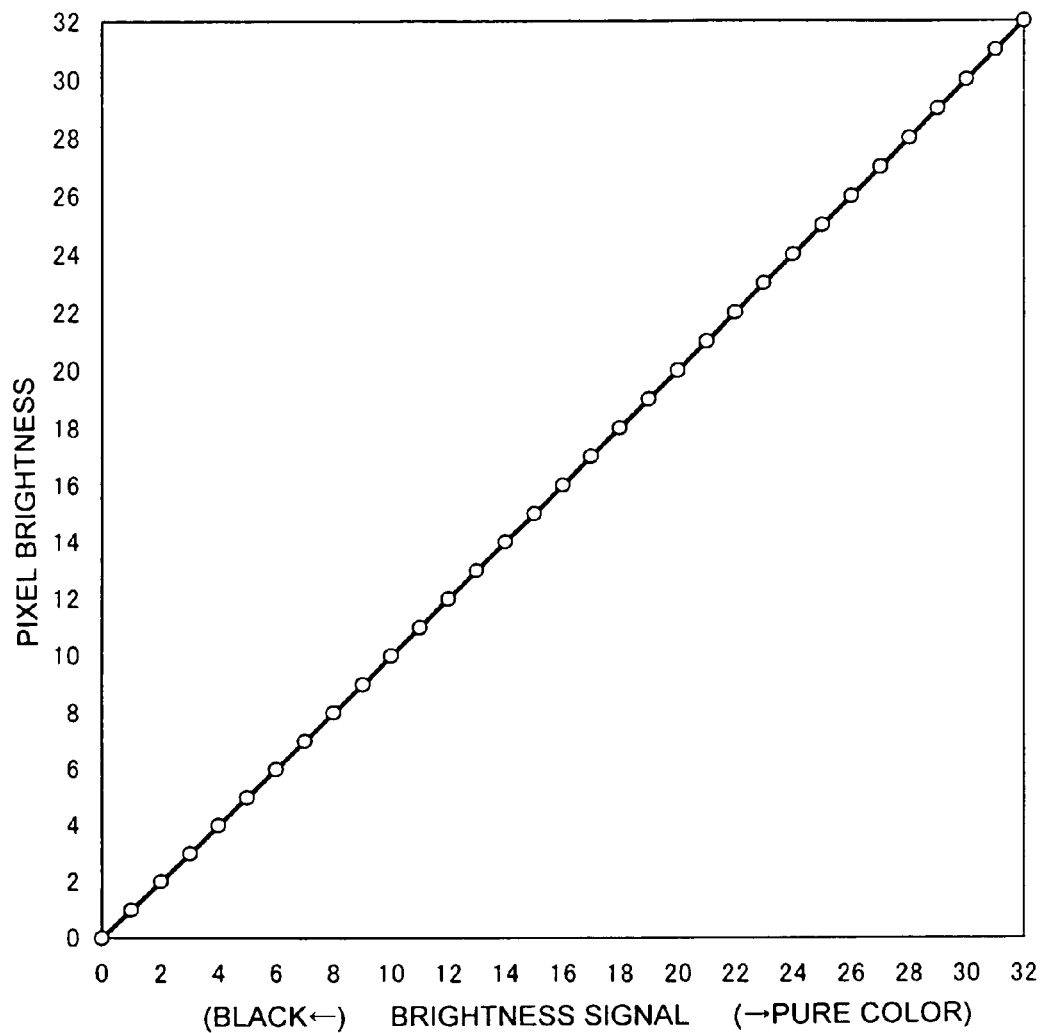
FIG. 7 is a diagram showing an example of relationship between a brightness signal and pixel brightness.

Here, for an ideal relationship between actual brightness of the primary colors lit on a display and brightness data values for the primary colors, as shown in FIG. 7, adjacent levels of gradations in the first test pattern images of each primary color is distinguishable when the first test pattern is displayed in the client device 3, as schematically shown in FIG. 10.

However, for the relationship as shown in FIG. 8, adjacent levels of gradations are not distinguishable in a certain gradation range closer to black, that is, corresponding to small brightness data values, and then become easily distinguishable as differences when a corresponding brightness data value exceeds a predetermined value. Further, for the relationship as shown in FIG. 9, adjacent levels of gradations are easily distinguishable in some ranges but not in others, as schematically shown in FIG. 12.

In light of the above, when information as to whether or not adjacent levels of gradations can be distinguished by the human eye is obtained as a result of making an evaluation using the first test pattern image, a change in actual brightness in accordance with a brightness data value (color expression characteristics) change with respect to a client device 3 can be estimated based on the information, the relationship being specific to the client device 3.

It should be noted that, whereas the evaluation as to whether or not changing gradations are distinguishable is made while changing the gradations in a stepwise manner in the above, different colors may be shown sequentially or at once so as to estimate color expression characteristics of the client device 3 based on the evaluation of their relationship.

Here, even though the display state of actual brightness relative to respective brightness data values for the primary colors can be estimated as described above, there still remains a problem that a color with no original saturation may appear to have the tone of an intense color, such as red. This problem cannot be solved without knowledge of the brightness balance among the primary colors. In order to address this problem, the second test pattern is displayed in a client device 3, asking the viewer to select a graphic element that appears white or gray (colors with saturation 0) to him so that brightness balance among the primary colors can be estimated.

Figure 13:
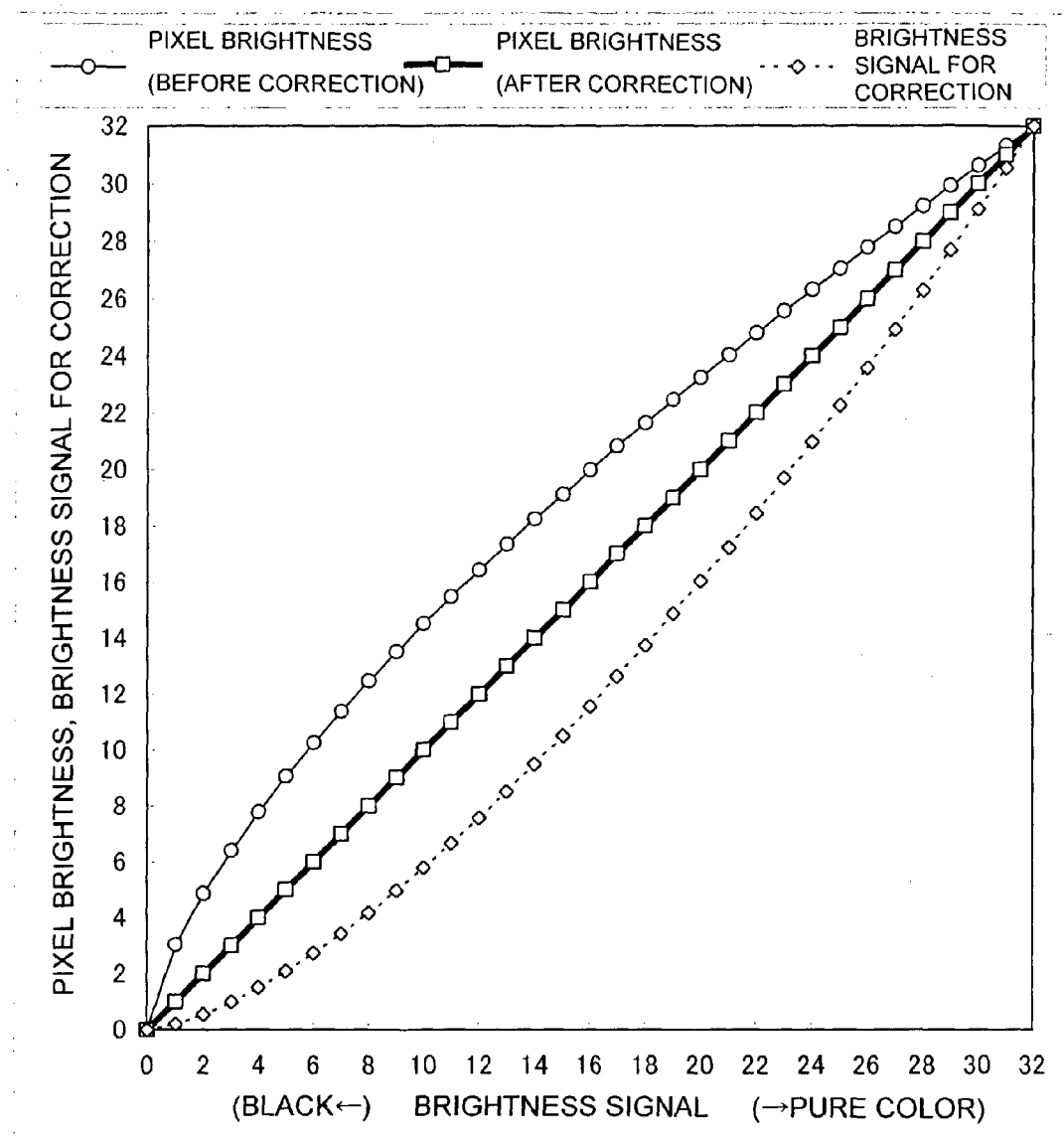
FIG. 13 is a diagram showing relationship between a brightness signal and pixel brightness, and inverted characteristics for correction.

Once actual brightness for respective brightness data values and brightness balance among respective primary colors are estimated as display characteristics, as described above, a brightness data value for the color of each pixel, defined by image data, and brightness balance among the respective primary colors for each pixel are adjusted, to thereby color correct the image data. For example, as shown in FIG. 13, when a display has display characteristics which correspond to gamma-correction with a gamma value γ=0.68 (represented by the solid line connecting circles in the drawing), color nuance defined by image data for each pixel is corrected under assumption that the image data has characteristics with a gamma value γ=1/0.68=1.46 (inverted characteristics of that of the display, indicated by the dot line connecting diamonds in the drawing). This adjustment can cause the relationship between brightness data values and actual brightness (solid line connecting squares) to conform to an ideal relationship when the image data is displayed in the client device 3.

For image data, such as GIF (Graphics Interchange Format) image data, in which displayed colors are determined based on a color LUT (CLUT; Color Look-Up Table), the color LUT information can be corrected to thereby achieve color correction. Alternatively, a standard LUT and a plurality of color-corrected LUTs may be stored in advance in the memory 12 so that an appropriate LUT is selected according to the display characteristics to replace the original LUT. This also achieves color correction.

It should be noted that 33 gradation levels are displayed, asking the user to evaluate distinguishability between adjacent levels of gradations in the above description, gradations at levels of smaller units, resulting in, for example, 65 levels, may be displayed to perform identical processing to the above. This may be applied when the display state may suddenly changes such as, for example, where adjacent levels of gradations are totally undistinguishable up to a certain point and thereafter clearly distinguishable, and therefore the characteristics can be only insufficiently estimated (that is, when inverted characteristics for correction are hardly determined).

That is, through repetitive attempts to obtain display state information while increasing the number of levels of gradations to a point where inverted characteristics can be obtained (characteristics can be estimated), finer correction can be made.

Interface

Figure 14:
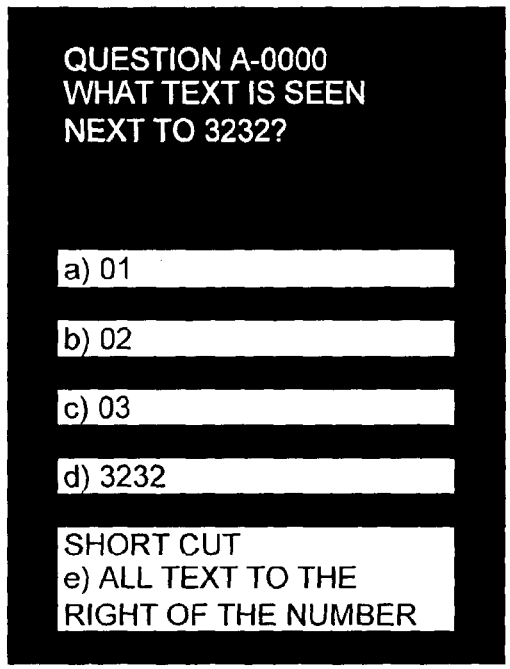
FIG. 14 is a diagram showing a specific example of an interface in the preferred embodiment of the present invention.
Figure 14:
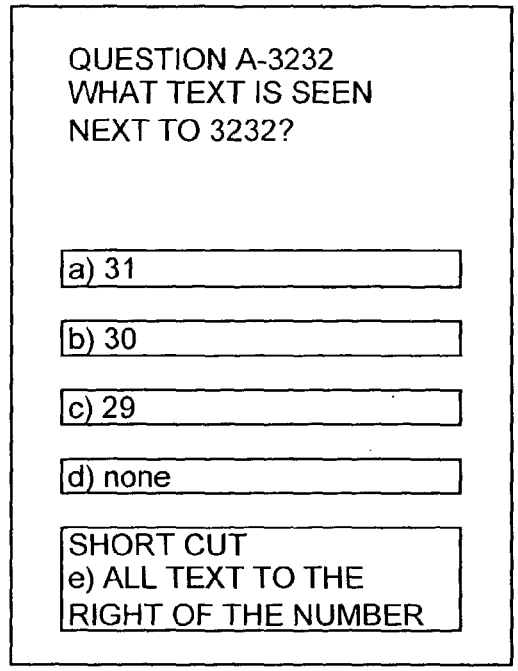

When displaying the first test pattern image as shown in FIG. 2 on a client device 3, the image processing device 1 in this embodiment preferably also displays an inquiry list as shown in FIGS. 14A, 14B so as to help the user understand what he is expected to evaluate in the process of obtaining display state information.

Specifically, as shown in FIG. 14A, a question such as "what text is seen to the right of 0000?" and button interfaces such as "01", "3232", "all text to the right of the number" are repeatedly displayed with respect to the respective rectangular regions, and user input through any of the buttons is detected to thereby obtain display state information. It should be noted that, for an arrangement as shown in FIG. 2, in particular, the right half column, for which a text column corresponding to, for example, "3232" is not available, a button interface "nothing" may be provided instead (FIG. 14B).

Figure 15:
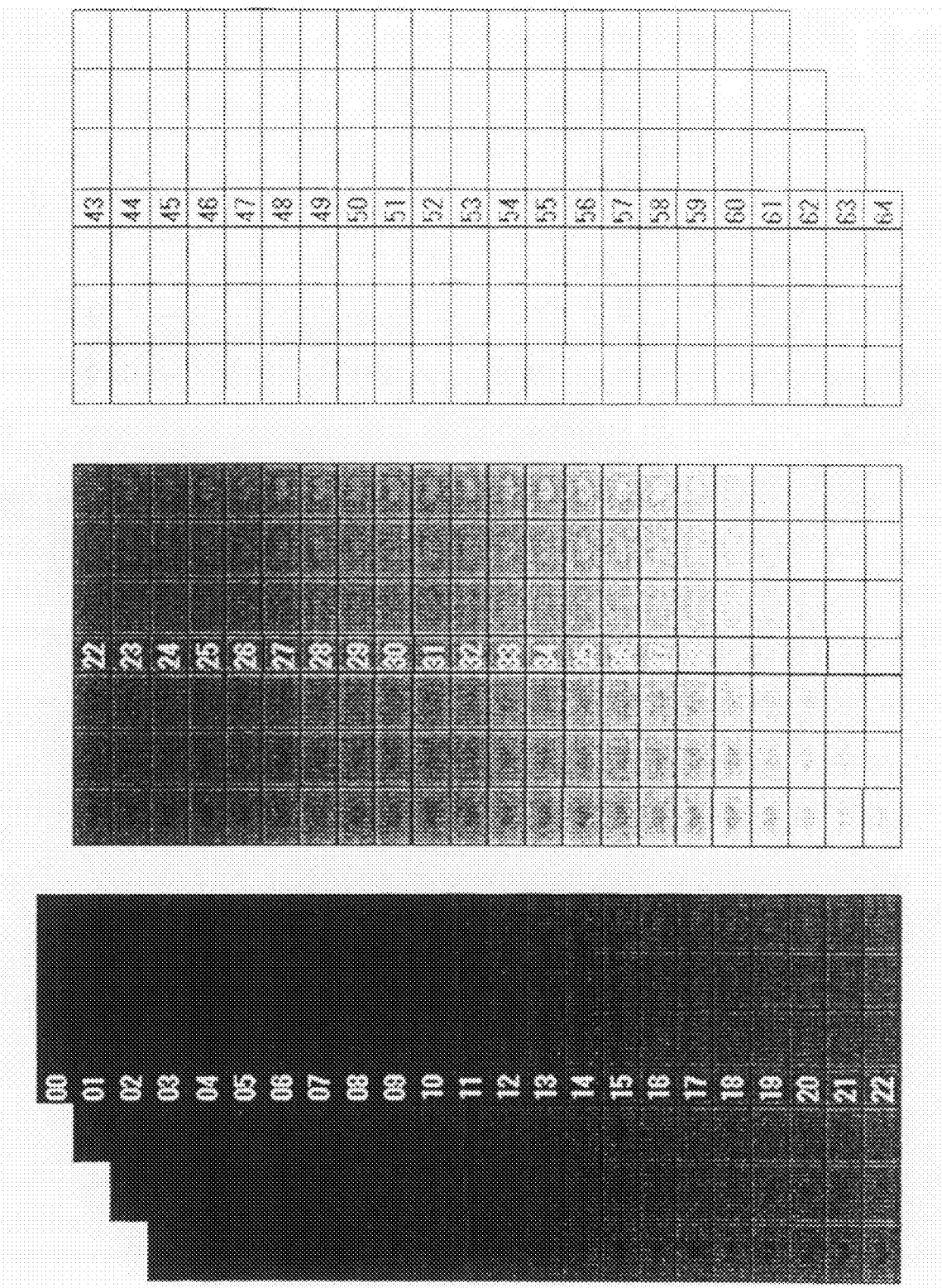
FIG. 15 is a diagram showing another specific example of an interface in the preferred embodiment of the present invention.

When a larger number of gradation levels are included and displaying of identifier of each rectangular region is hardly displayed, as shown in FIG. 15, any graphic, such as a heart mark, may be displayed colored with gradations changing in a stepwise manner in each rectangular region, while asking the user to click distinguishable graphics among those which are located directly right or left to the identifier column. Then, by detecting the user input, display state information can be obtained.

Determination of Color Range

Figure 16:
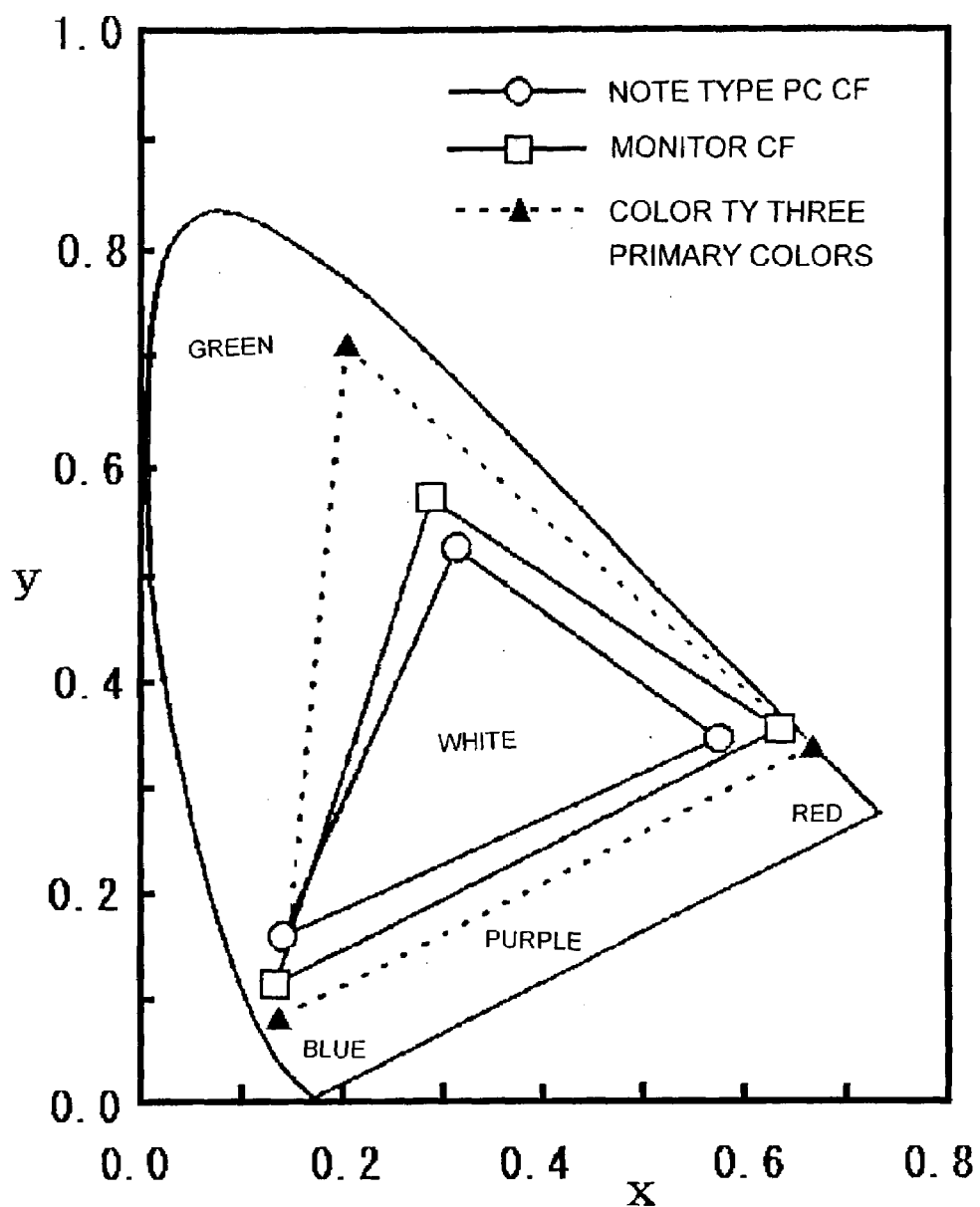
FIG. 16 is a diagram showing an example of color regions for various displays.

The above description is based on an assumption that colors of image data stored in the image database 11 fall within a range of colors which are displayable in the client device 3. However, the range of colors which are displayable in the client device 3 may be limited, as shown in FIG. 16. A relatively large range of colors is displayable using primary colors of ordinary cathode ray televisions, as indicated by the broken lines with triangular marks in FIG. 16, while LCDS, whether portable (represented by the line with circular marks) or desktop (represented by the line with square marks) devices, have a relatively narrow displayable color range, as indicated by the solid line in the drawing. Here it should be noted that a displayable color range is a characteristic inherent to each display, and is not changeable through the correction described above.

Here, in a system of this embodiment, prior to the processing of FIG. 5, the type of display employed by the client device 3 may be determined, for example by prompting a user to input this information or by reading system setting information of the client device 3, and information concerning a displayable color range of a display of the type is obtained (either from manufacturers or via a search).

Specifically, when providing the image data requested by the client device 3, a color range which is necessary to express the image data is compared with the color range displayable by the display. If the necessary color range is not completely within the displayable color range (even if not partially), a dialogue such as "[i]mage may not be displayed with full tones. Continue display?" may be shown and, in response to an instruction to continue display, the image data will be provided after the above correction is applied thereto. On the other hand, in response to an instruction to halt display, provision of data is suspended.

[Simulation of Light Source]

In this embodiment, light source simulation is applied in addition to the characteristic estimation and correction and the color range determination, as described above, so that color nuance of image data is corrected according to information, provided from the client device 3, which specifies a light source.

That is, appearance of an object under various conditions is simulated through color nuance correction. For this simulation, each image data is stored in the image database 11 in a manner of associating it with color temperature or Micro Reciprocal Degrees under condition under which the concerned image data is created (shooting condition), the Micro Reciprocal Degrees being obtained by dividing $10^6$ by color temperature.

For the simulation, the image processing device 1 obtains information from the client device 3, which specifies a condition (sunny, cloudy, morning, evening, and so forth as environment; and sunlight, white light, fluorescent light, mercury lamp, and so forth as a light source), and uses this information in color temperature correction. For example, when image data capturing condition is "sunny and sunlight (or daylight)", in which the color temperature is about 5500 K (corresponding to about 182 Micro Reciprocal Degrees), and the information provided by the client device 3 specifies a condition "indoor and white light", in which the color temperature is about 3200 K (corresponding to about 313 Micro Reciprocal Degrees), compensation is made for the −1300 K difference in the color temperature (a Micro Reciprocal Degree difference, or an LB value, is −131). The correction can be made by modifying hue and saturation using a known method.

It should be noted that the image processing device 1 may perform just light source simulation, rather than estimation of color expression characteristics and color balance of a client device 3 and color correction based on the estimation.

Operation

Next, operation of the image processing device in this embodiment will be described using an example wherein the image database 11 of the image processing device 1 stores image data concerning products such as clothes. A user wishing to make a purchase using the client device 3 accesses the image processing device 1 and requests image data of products for sale. The image processing device 1 then identifies the client device 3 with reference to its IP address, a user name, or the like (input by the user), and determines whether or not a result of previous check on the color expression and color balance characteristics of that client device 3 is available. If not, a first test pattern image as shown in FIG. 2 is provided to the client device 3, where the pattern is displayed and the user is inquired about distinguishable gradation difference for each rectangular region (A). The image processing device 1 then obtains the user's answer and information concerning color expression characteristics on the client device 3, which is determined based on the answer.

Then, the image processing device 1 provides to the client device 3 a second test pattern image as shown in FIG. 3, asking the user to select the one color which appears pure white or gray having the lowest saturation. The image processing device 1 obtains the user answer and further information concerning color balance characteristics of the client device 3 based on the answer. Then, the image processing device 1 applies color correction to the requested image data based on the characteristics and provides the color-corrected image data to the client device 3. Accordingly, the client device 3 receives and displays the image data having corrected color expression and color balance characteristics.

This arrangement allows the user to see images of products displayed in colors closer to their original ones. That is, the user is offered a circumstance in which he can purchase a product based on precise impression on its colors.

Moreover, simulation of a light source allows a user to check the appearance of a product, such as clothing, which may look different under different conditions. This adds additional convenience.

It should be noted that, prior to estimation of display characteristics of each client device 3, the image processing device 1 may ask a user of each client device 3 to set appropriate contrast and multiple colors. Also for this setting, preferably, adjustment image data may be provided.

Application

It should be noted that, whereas the image processing device 1 recognizes display characteristics of the client device 3 and processes requested image data based on the characteristics before provision to the client device 3 in the above, the image processing device 1 may provide a process program to the client device 3, together with the image data, so that the client device 3 can process the data to the client device 3, rather than processing the image data before provision. This modification can be readily achieved using techniques such as Java (trademark) and so forth.

Second Embodiment

Figure 17:
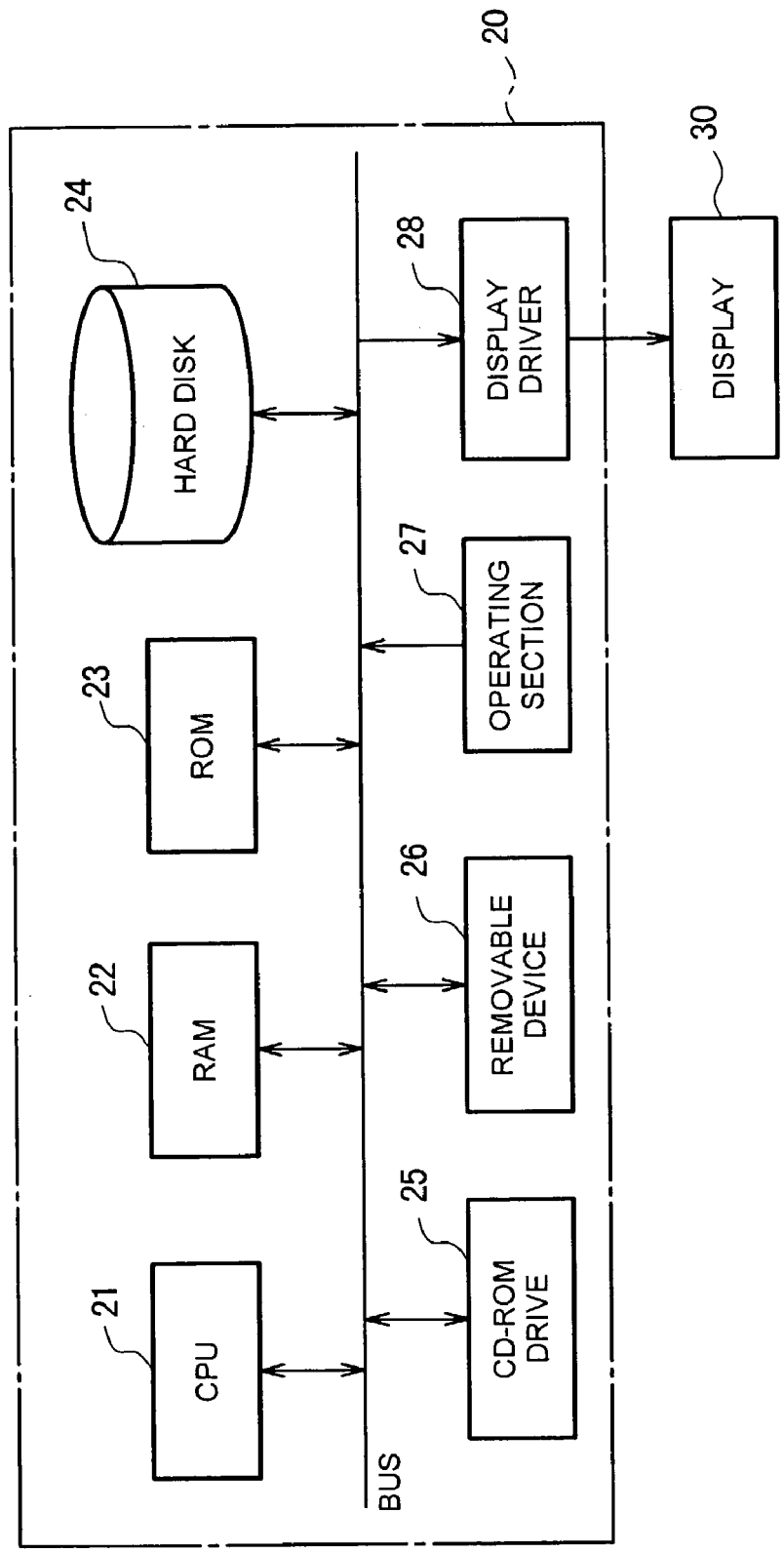
FIG. 17 is a diagram showing another preferred embodiment of the present invention.
Figure 15:
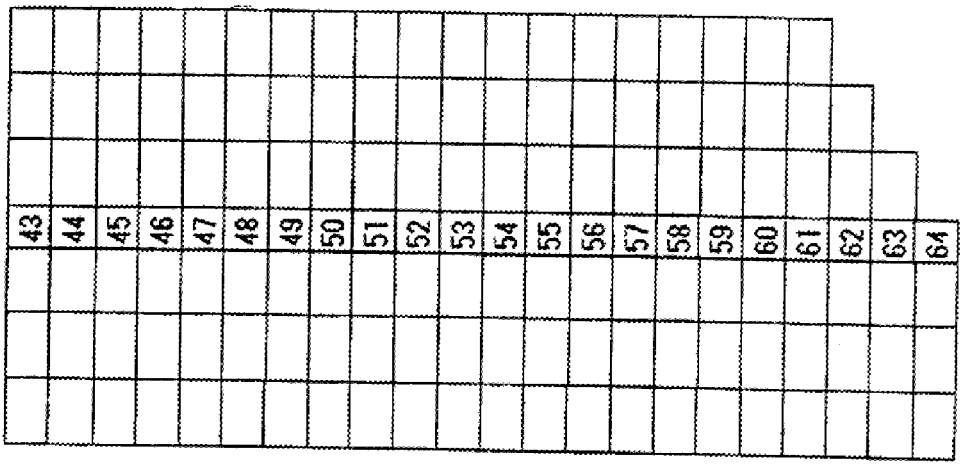
Figure 15:
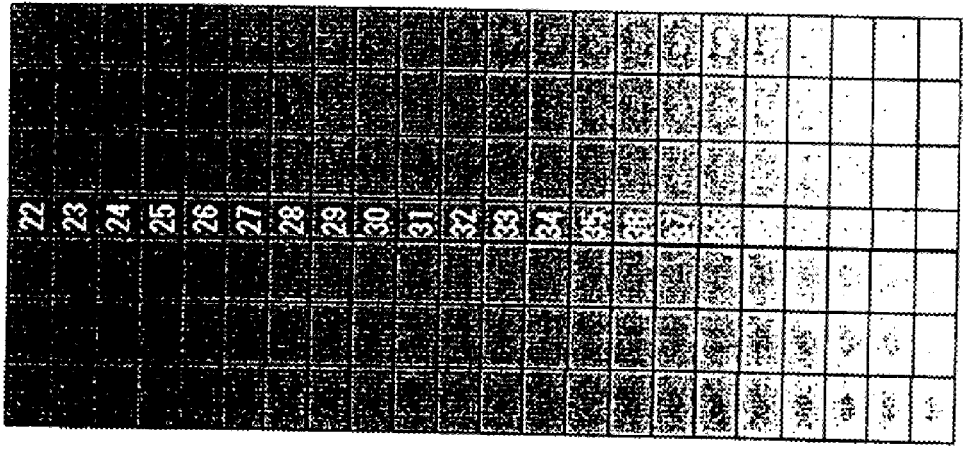
Figure 15:
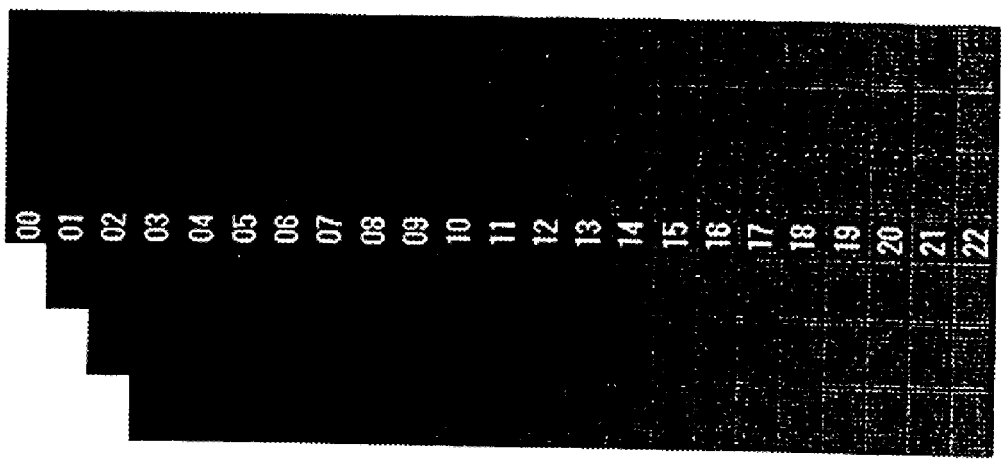

An image processing device in a second preferred embodiment of the present invention is a stand-alone personal computer. That is, the image processing device 20 in this embodiment basically comprises a CPU 21, a RAM 22, a ROM 23, a hard disk 24, a CD-ROM drive 25, a removable device 26, an operating section 27, and a display driver 28, all being mutually connected via a bus, as shown in FIG. 17. The image processing device 1 is connected to the display 30 via the display driver 28. The operating section 27 may comprise a keyboard and a mouse.

The CPU 21 basically determines a color range, estimates color expression characteristics based on display state information obtained, estimates color balance, and correct image data based on the estimation. These processes are described below.

The RAM 22 serves as a working memory of the CPU 21, temporarily storing image data and so forth which is processed in the CPU 21. The ROM 23 mainly stores software to be executed by the CPU 21 when the image processing device in this embodiment is activated (software to activate an operating system and so forth).

The hard disk 24 stores various programs to be executed by the CPU 21. The CD-ROM drive 25 reads out data from a CD-ROM and outputs it to the CPU 21. The removable device 26 reads concerned data from a removable media, such as a floppy disk, an MO disk, and so forth, which store data electromagnetically or optically, and outputs it to the CPU 21.

That is, the CPU 21 controls reading-out of image processing program which is provided stored in a CD-ROM or other removable media, storage of the program in a hard disk 24, and execution of the program.

The operating section 27 outputs content of the user operation to the CPU 21. The display driver 28, which is connected to the display 30, causes the display 30 to display image data in response to an instruction from the CPU 21.

The display 30 may be a CRT, a liquid crystal display (an LCD), or the like, and display image data supplied from the CPU 21 via the display driver 28.

Here, processing in the CPU 21 will be described. For color range determination, the CPU 21 checks a color range which is necessary for displaying the image data to be displayed on the display 30, and compares the checked color range with a color displayable range of the display device 30. When the necessary color range is larger than the displayable color range (even if the necessary color range is partially excluded), a message is displayed asking the user whether or not he wishes to continue displaying of the image data. The CPU 21 controls the display 30 to display the image data when it receives the user's instruction to proceed, and to suspend displaying of the image data for an instruction not to display.

Then, image data is corrected based on the estimated color expression and color balance characteristics. Specifically, as processing corresponding to that of FIG. 5, the CPU 21 responsive to a request for displaying image data stores the image data in the RAM 22 and checks whether or not display characteristic information (color expression and color balance characteristics) of that display is stored in the RAM 22. If not, the CPU 21 controls such that the first test pattern image for each primary color is displayed on the display 30, obtains information concerning distinguishability of the first test pattern image by human eyes from the user via the operation section 27, estimates color expression characteristics based on the evaluation information, and stores the color expression characteristics in the RAM 22. Processing of obtaining evaluation information is identical to that which is described in the first embodiment and more detailed description thereof is not repeated here.

The CPU 21 controls display of the second test pattern image on the display 30, asking the user to select the one color which appears to the lowest saturation and appears purest white or gray to him, estimates color balance characteristics based on the selection, and stores the estimated color balance characteristics in the RAM 22. Processing of asking selection of one with the lowest saturation is identical to that which is described in the first embodiment and more detailed description thereof is not repeated here.

As described above, the CPU 21 obtains display characteristics including color expression and color balance characteristics, calculates inverted characteristics of the display characteristics, corrects image data stored in the RAM 22 based on the inverted characteristics, and displays the resultant image data on the display 30.

Further, also in this embodiment, color temperature may be simulated according to a light source in response to a user instruction which specifies a light source, similarly to the first embodiment.

As described above, enhanced color reproductivity of image data stored in a media such as a CD-ROM can be achieved also in a local device without using a network.

Operation

In this embodiment, in the reading-out of product image data or test pattern image from a recording media, such as a CD-ROM, using the CD-ROM drive 25, and displaying of the data on the display 30, an inquiry is made to a user, using the first and second test pattern images stored in the CD-ROM, to estimate display characteristics, and product image data is corrected based on the estimation. Then, product image data is corrected based on the estimated display characteristics, and the resultant product image data is displayed on the display 30. This allows the user to evaluate a product using an image displayed with more accurate colors.

INDUSTRIAL APPLICABILITY

As described above, an image processing device according to the present invention is useful as a device for precisely reproducing colors of image data when the image data is displayed on a computer, and particularly suitable for an embodiment in which catalogue images are provided using a computer for selling products.

The invention claimed is:

1. An image processing device for providing image data to a client device to display the image data in the client device, comprising:
   an information collecting section for sending a test pattern image to the client device to obtain from a user information as to distinguishability of gradations of the test pattern image by the human eye as display state information, the test pattern image comprising pattern elements to be selected by the user, the pattern elements being aligned such that the gradations are sequentially changed in reference units;
   an estimation section for estimating color displaying capability of the client device based on the display state information obtained from the client device; and
   a correction section for applying color correction to image data, based on the estimated color displaying capability, wherein
   image data which has been color corrected is provided to the client device.

2. The image processing device according to claim 1 wherein
   a test pattern image is available for each primary color and comprises pattern elements which are colored in each primary color alone and aligned such that gradations are sequentially changed in reference units,
   the information collecting section sequentially sends the test pattern images of the respective primary colors to sequentially obtain the display state information concerning display state of the test pattern images of the respective primary colors in the client device when viewed by the human eye, and
   the estimation section estimates color displaying capability of the client device based on the display state information concerning display state of the test pattern images of the respective primary colors in the client device which is determined by the human eye.

3. The image processing device according to claim 1, wherein
   the information collecting section further sends a second test pattern image to the client device to obtain information concerning appearance to the human eye of the second test pattern when displayed by the client device, the second test pattern comprising color samples which are colored so as to have a substantially white or gray color obtained by blending the respective primary colors in a predetermined ratio and arranged according to a predetermined rule determined according to the predetermined ratio,
   the image processing device further comprises a second estimation section for estimating display intensity of the respective primary colors displayed by the client device, based on the information concerning appearance to the human eye of the second test pattern image when displayed by the client device, and the correction section applies color correction to the image data, based on the estimated color displaying capability and the display intensity of the respective primary colors estimated by the second estimation section.

4. The image processing device according to claim 1, wherein the information collecting section repetitively provides a test pattern image having gradations which are changed in smaller reference units until the color displaying capability of the client device is estimated by the estimation section, to thereby repetitively conduct processing to obtain the display state information.

5. The image processing device according to claim 1, further comprising:

an obtaining section for obtaining information specifying a light source, wherein the correction section applies color correction based on the estimated color displaying capability and the information specifying a light source.

6. An image processing device having a display section for controlling displaying of image data, comprising:

an information collecting section for displaying in the display section a test pattern image to obtain from a user information concerning evaluation regarding distinguishability of gradations of the test pattern image by the human eye as display state information, the test pattern image comprising pattern elements to be selected by the user, the pattern elements being aligned such that the gradations are sequentially changed in reference units;

an estimation section for estimating color displaying capability of the display section based on the obtained display state information; and a correction section for applying color correction to image data, based on the estimated color displaying capability.

7. The image processing device according to claim 6 wherein a test pattern image is available for each primary color and comprises pattern elements which are colored in each primary color alone and aligned such that gradations are sequentially changed in reference units, the information collecting section sequentially displays the test pattern images of the respective primary colors to sequentially obtain the display state information concerning display state of the test pattern images for the respective primary colors in the display section, and the estimation section estimates color displaying capability of the display section based on the display state information concerning display state of the test pattern images of the respective primary colors in the display section.

8. The image processing device according to claim 6, wherein the information collecting section further displays a second test pattern image in the display section to obtain information concerning appearance of the second test pattern to the human eye, the second test pattern image comprising color samples which are colored so as to have a substantially white or gray color obtained by blending the respective primary colors in a predetermined ratio and arranged according to a predetermined rule determined according to the predetermined ratio, the image processing device further comprises a second estimation section for estimating display intensity of the respective primary colors displayed in the display section, based on the information concerning appearance of the second test pattern image to the human eye, and the correction section applies color correction to the image data, based on the estimated color displaying capability and the displaying intensity of the respective primary colors estimated by the second estimation section.

9. The image processing device according to claim 6, wherein the information collecting section repetitively provides a test pattern image having gradations which are changed in smaller reference units until the color displaying capability of the display section is estimated by the estimation section, to thereby repetitively conduct processing to obtain the display state information.

10. The image processing device according to claim 6, further comprising:

an obtaining section for obtaining information specifying a light source, wherein the correction section applies color correction based on the estimated color displaying capability and the information specifying a light source.

11. An image processing device for providing image data to a client device to display the image data in the client device, comprising:

an information collecting section for sending test image data containing different colors to be selected by a user to the client device to obtain from the user information concerning evaluation regarding distinguishability of gradations of the test image data by the human eye, wherein color correction is applied in advance to image data to be provided to the client device, based on the obtained information concerning the evaluation made in the client device.

12. The image processing device according to claim 11, wherein the color correction is applied by creating a color look-up table for each image data based on the information concerning the evaluation.

13. The image processing device according to claim 11, wherein the color correction is applied by selecting a color look-up table from among a plurality of color look-up tables provided in advance for each image data, based on the information concerning the evaluation.

14. An image processing device for displaying image data, comprising:

an information collecting section for displaying test image data containing different colors to be selected by a user to obtain from the user information as to distinguishability of the respective colors of the test image data by human eye, wherein color correction is applied in advance to image data, based on the obtained information concerning the evaluation.

15. The image processing device according to claim 14, wherein the color correction is applied by creating a color look-up table for each image data based on the information as to distinguishability.

16. The image processing device according to claim 14, wherein the color correction is applied by selecting a color look-up table from among a plurality of color look-up tables provided in advance for each image data, based on the information as to distinguishability.

17. An image processing device for providing image data to a client device to display the image data in the client device, comprising:

an information collecting section for sending a test pattern image to the client device to be selected by a user, the test pattern image comprising an image element with a predetermined gradation and a plurality of image elements with gradations different from the predetermined gradation, the plurality of image elements being arranged relative to the image element having the predetermined level of gradation so as to contact to one another to obtain from the user information concerning evaluation regarding distinguishing of the image elements of the test pattern image by the human eye as display state information; and a correction section for applying color correction to image data, based on the obtained display state information of the client device, wherein image data which has been color corrected is provided to the client device.

18. An image processing device having a display section for displaying image data, comprising:

an information collecting section for displaying in the display section a test pattern image comprising an image element with a predetermined gradation and a plurality of image elements with gradations different from the predetermined gradation to be selected by a user, the plurality of image elements being arranged relative to the image element having the predetermined level of gradation so as to contact to one another to obtain from the user information as to distinguishability of the image elements of the test pattern image by the human eye as display state information; and a correction section for applying color correction to image data, based on the obtained display state information.

19. An image processing device for providing image data to a client device to display the image data with the client device, comprising:

an information collecting section for sending a first test pattern image to the client device to obtain from a user information as to distinguishability of gradations of the first test pattern image by the human eye as first display state information, the first test pattern image comprising pattern elements aligned such that the gradations are sequentially changed in reference units, and also for sending a second test pattern image to the client device to obtain information concerning appearance of the second test pattern image to the human eye in the client device as second display state information, the second test pattern image comprising color samples which are colored so as to have a substantially white or gray color obtained by blending the respective primary colors in a predetermined ratio and arranged according to a predetermined rule determined according to the predetermined ratio;

an obtaining means for obtaining information specifying a light source from the client device;

a first estimation section for estimating color displaying capability of the client device based on the first display state information;

a second estimation section for estimating displaying intensity of the primary colors displayed in the client device, based on the second display state information; and a correction section for applying color correction to the image data, based on the estimated color displaying capability, the estimated displaying intensity of the primary colors, and the obtained information specifying a light source, wherein image data which has been color corrected is provided to the client device.

20. A method for providing image data, comprising the steps of:

sending a test pattern image to a client device to obtain from a user information concerning evaluation regarding distinguishability of gradations of the test pattern image by the human eye as display state information, the test pattern image comprising pattern elements to be selected by the user, the pattern elements aligned such that the gradations are sequentially changed in reference units;

estimating color displaying capability of the client device based on the display state information obtained from the client device;

applying color correction to image data, based on the estimated color displaying capability; and providing image data which has been color corrected to the client device.

21. A method for providing image data, comprising:

providing test image data containing different colors to be selected by a user to a client device to obtain from the user information concerning evaluation regarding distinguishability of the respective colors of the test image data determined by the human eye from the client device; and applying color correction in advance to image data, based on the obtained information concerning the evaluation made in the client device.

22. A method for displaying image data, comprising the steps of:

displaying test image data containing a plurality of colors to be selected by a user to obtain from the user information as to distinguishability of the respective colors of the test image data by the human eye; and applying color correction in advance to the image data, based on the obtained information as to distinguishability by the human eye.

23. A computer readable recording media storing an image data providing program which comprises:

a module for sending a test pattern image to a client device to obtain from a user information concerning distinguishability of gradations of the test pattern image by the human eye as display state information, the test pattern image comprising pattern elements to be selected by the user, the pattern elements being aligned such that the gradations are sequentially changed in reference units;

a module for estimating color displaying capability of the client device based on the display state information obtained from the client device;

a module for applying color correction to image data, based on the estimated color displaying capability; and a module for providing image data which has been color corrected to the client device.

24. A computer readable recording media storing an image data providing program which comprises:

a module for sending test image data containing different colors to be selected by a user to a client device to obtain from the user information as to distinguishability of the respective colors of the test image data by the human eye; and a module for applying color correction in advance to image data, based on the obtained information as to distinguishability of the test image data by the human eye in the client device.

25. A computer readable recording media storing an image displaying program which comprises:

a module for displaying test image data containing different colors to be selected by a user to obtain from the user information as to distinguishability of the respective colors of the test image data by the human eye; and a module for applying color correction in advance to the image data to display, based on the obtained information as to distinguishability.

26. A computer readable recording media storing test pattern image data comprising:

a program to electronically display on a display aligned image elements to be selected by a user prior to color correction, the image elements having gradations which are sequentially changed in reference gradation units that are distinguishable by a user's eye for obtaining from the user information concerning evaluation regarding distinguishability of the gradations of the image elements.

27. A computer readable recording media storing test pattern image data comprising an image element with a predetermined gradation and a plurality of image elements with gradations different from the predetermined gradation which are arranged relative to the image element having the predetermined level of gradation so as to contact to one another, to be selected by a user and distinguishable by the user's eye.

28. A means for creating a test pattern image, comprising the steps of:

creating a basic image element having a predetermined level of gradation;

creating n-number of image elements to be selected by a user having a plurality of levels of gradations which are different from the predetermined level of gradation, n being an integer from 1 to n, the image elements being distinguishable by the user's eye; and arranging each of the n-number of image elements relative to the basic image element such that the n number of image elements are in contact to one another.

* * * * *

UNITED STATES PATENT AND TRADEMARK OFFICE
CERTIFICATE OF CORRECTION

PATENT NO. : 7,283,139 B1 Page 1 of 6
APPLICATION NO. :10/221350
DATED : October 16, 2007
INVENTOR(S) : Tanaka It is certified that error appears in the above-identified patent and that said Letters Patent is hereby corrected as shown below:

Delete drawing sheets 2,10,11,12 and 15, and substitute therefor drawing sheets 2,10,11,12 and 15. (attached)

Signed and Sealed this

Thirtieth Day of September, 2008

JON W. DUDAS
*Director of the United States Patent and Trademark Office*

A { 
| 0000 | 3232 |
|------|------|
| 0101 | 3131 |
| 0202 | 3030 |
| 0303 | 2929 |
| 0404 | 2828 |
| 0505 | 2727 |
| 0606 | 2626 |
| 0707 | 2525 |
| 0808 | 2424 |
| 0909 | 2323 |
| 1010 | 2222 |
| 1111 | 2121 |
| 1212 | 2020 |
| 1313 | 1919 |
| 1414 | 1818 |
| 1515 | 1717 |
| 1616 | 1616 |

FIG. 2

| | |
|---|---|
| 0000 | 3232 |
| 0101 | 3131 |
| 0202 | 3030 |
| 0303 | 2929 |
| 0404 | 2828 |
| 0505 | 2727 |
| 0606 | 2626 |
| 0707 | 2525 |
| 0808 | 2424 |
| 0909 | 2323 |
| 1010 | 2222 |
| 1111 | 2121 |
| 1212 | 2020 |
| 1313 | 1919 |
| 1414 | 1818 |
| 1515 | 1717 |
| 1616 | 1616 |

FIG. 10

| | |
|---|---|
| 0000 | 3232 |
| 0101 | 3131 |
| 0202 | 3030 |
| 0303 | 2929 |
| 0404 | 2828 |
| 0505 | 2727 |
| 0606 | 2626 |
| 0707 | 2525 |
| 0808 | 2424 |
| 0909 | 2323 |
| 1010 | 2222 |
| 1111 | 2121 |
| 1212 | 2020 |
| 1313 | 1919 |
| 1414 | 1818 |
| 1515 | 1717 |
| 1616 | 1616 |

FIG. 11

| 0000 | 01 | 02 | 03 | 3232 |
|------|----|----|----|------|
| 0101 |    | 03 | 04 | 3131 |
| 0202 |    | 04 | 05 | 3030 |
| 0303 |    |    | 06 | 2929 |
| 0404 |    | 06 | 07 | 2828 |
| 0505 |    | 07 | 08 | 2727 |
| 0606 |    |    |    | 2626 |
|      |    |    |    | 2525 |
|      |    |    |    | 2424 |
|      |    |    |    | 2323 |
|      |    |    |    | 2222 |
|      |    |    |    | 2121 |
|      |    |    |    | 2020 |
|      |    |    |    | 1919 |
|      |    |    |    | 1818 |
|      |    |    |    | 1717 |
|      |    |    |    | 1616 |

FIG. 12